(12) United States Patent
Sugawara

(10) Patent No.: US 7,413,831 B2
(45) Date of Patent: Aug. 19, 2008

(54) REFLECTIVE EXPOSURE MASK, AND METHOD FOR PRODUCING AND USING THE SAME

(75) Inventor: Minoru Sugawara, Kanagawa (JP)

(73) Assignee: Sony Corporation (JP)

( * ) Notice: Subject to any disclaimer, the term of this patent is extended or adjusted under 35 U.S.C. 154(b) by 759 days.

(21) Appl. No.: 10/503,570

(22) PCT Filed: Feb. 25, 2003

(86) PCT No.: PCT/JP03/02071

§ 371 (c)(1),
(2), (4) Date: Aug. 5, 2004

(87) PCT Pub. No.: WO03/071590

PCT Pub. Date: Aug. 28, 2003

(65) Prior Publication Data

US 2005/0089761 A1 Apr. 28, 2005

(30) Foreign Application Priority Data

Feb. 25, 2002 (JP) .............................. 2002-047474

(51) Int. Cl.
*G03F 1/14* (2006.01)
*G03F 7/20* (2006.01)
*G21K 1/06* (2006.01)
(52) U.S. Cl. .............................. 430/5; 430/311; 378/35
(58) Field of Classification Search ...................... 430/5, 430/311

See application file for complete search history.

(56) References Cited

U.S. PATENT DOCUMENTS 5,641,593 A 6/1997 Watanabe et al.

2002/0045108 A1 * 4/2002 Lee et al. ........................ 430/5

(Continued)

FOREIGN PATENT DOCUMENTS

EP 0 708 367 A1 4/1996

(Continued)

OTHER PUBLICATIONS

International Search Report dated Jun. 17, 2003.

*Primary Examiner*—Mark F. Huff
*Assistant Examiner*—John Ruggles
(74) *Attorney, Agent, or Firm*—Rader Fishman & Grauer PLLC; Ronald P. Kananen

(57) ABSTRACT

When producing an exposure mask including a stack of reflective layers for reflecting extreme ultraviolet light, an absorber film for covering a light reflection plane of the stack of reflective layers with a predetermined pattern, and a buffer film interposed therebetween, the swing effect and the bulk effect that occur on a transferred portion of the predetermined pattern are specified in accordance with characteristic values of forming materials of the absorber film and the buffer film and optical conditions when exposing, and a forming film thickness of the absorber film is decided in consideration of the specified swing effect and the specified bulk effect so that the line width variation of the pattern and/or pattern shift of the pattern are at their minimum values. As a result, even for an exposure mask capable of dealing with extreme ultraviolet light, the line width variation and pattern shift after a wafer is exposed are minimized, and therefore it is possible to realize miniaturization of a transferred image appropriately.

20 Claims, 16 Drawing Sheets

U.S. PATENT DOCUMENTS

| | | |
|---|---|---|
| 2002/0115000 A1 | 8/2002 | Gupta et al. |
| 2003/0123605 A1* | 7/2003 | Rau .............................. 430/5 |
| 2005/0186486 A1* | 8/2005 | Sugawara ...................... 430/5 |
| 2006/0099517 A1* | 5/2006 | Sugawara ...................... 430/5 |

FOREIGN PATENT DOCUMENTS

| | | |
|---|---|---|
| JP | 63-237523 A1 | 10/1988 |
| JP | 06-097052 A1 | 4/1994 |
| JP | 2002-280291 A1 | 9/2002 |

* cited by examiner

REFLECTIVE EXPOSURE MASK, AND METHOD FOR PRODUCING AND USING THE SAME

TECHNICAL FIELD

The present invention relates to a method for producing an exposure mask used in a lithography process for forming a circuit pattern of a semiconductor device and to an exposure mask itself. In particular, the present invention relates to a method for producing an exposure mask and an exposure mask for so-called extreme ultraviolet light and, more particularly, to a method for producing a semiconductor device using the exposure mask.

BACKGROUND ART

In recent years, as semiconductor devices are miniaturized, there are needs for miniaturizing a pattern width, a pattern pitch (line width), and so forth, of a circuit pattern formed on a wafer, a resist pattern for forming a circuit pattern, and so forth. These needs can be satisfied by using ultraviolet light having a shorter wavelength to expose the resist pattern. As semiconductor devices are miniaturized, ultraviolet light having short wavelengths is used to expose wafers. For a semiconductor device produced corresponding to a design rule of 350 nm, ultraviolet light having a wavelength of 365 nm is used; for semiconductor devices produced corresponding to design rules of 250 nm and 180 nm, ultraviolet light having a wavelength of 248 nm is used; and for semiconductor devices produced corresponding to design rules of 130 nm and 100 nm, ultraviolet light having a wavelength of 193 nm is used. Currently, ultraviolet light having even a wavelength of 157 nm is used.

It is known that resolutions corresponding to these wavelengths are expressed by Rayleigh's formula, $w=k1 \times (\lambda/NA)$, where w represents a minimum width of a pattern that is to be resolved, NA represents a numerical aperture of a lens of a projection optical system; $\lambda$ represents a wavelength of exposure light; k1 represents a process constant that depends on the performance of the resist pattern, the use of resolution enhancement technology, and so forth. It is known that when the optimum resist pattern and super high resolution technology are used a process constant of k1=around 0.35 can be selected. In the super high resolution technology, ±first order diffraction light that passes through a mask and is diffracted by a light insulating pattern on the mask is selectively used so as to obtain a pattern smaller than a wavelength. Theoretically, a much smaller pattern can be obtained using ±n-th order diffraction light (where $n \geq 2$). However, the intensity of the diffraction light remarkably decreases. In addition, the pattern is restricted by the pupil of the projection optical system. Thus, it is not practical to use ±n-th order diffraction light (where $n \geq 2$).

According to the Rayleigh's formula, it is found that when ultraviolet light having a wavelength of 157 nm is used and a lens having NA=0.9 is used, the minimum pattern width is 61 nm. In other words, to obtain a pattern width smaller than 61 nm, it is necessary to use ultraviolet light having a shorter wavelength than 157 nm.

Thus, recently, the use of ultraviolet light having a wavelength of 13.5 nm, referred to as extreme ultraviolet light, has been considered for use as ultraviolet light having a shorter wavelength than 157=n. However, there are materials such as calcium fluoride ($CaF_2$) and silicon dioxide ($SiO_2$) that have light transmissivities for ultraviolet light having a wavelength of up to 157 nm. Thus, a mask and an optical system that are capable of transmitting these ultraviolet lights can be produced. However, there are no materials that are capable of transmitting extreme ultraviolet light having a wavelength of 13.5 nm with a desired thickness. Thus, when extreme ultraviolet light having a wavelength of 13.5 nm is used, it is necessary to structure a mask and an optical system as a reflective type mask and a reflection type optical system that reflects light rather than a light transparent mask and a light transmission type optical system, respectively.

When a light reflective type mask and a light reflection type optical system are used, light reflected on a mask surface has to be guided to a projection optical system without interference with light that enters the mask Thus, light that enters the mask should inevitably have an incident angle of $\phi$ against the normal line of the mask surface. This angle depends on the numerical aperture NA of the lens of the projection optical system, magnification m of the mask, and the size $\sigma$ of the lighting source. More specifically, when a mask having a reduction factor of, for example, 5× is used on a wafer, in an exposure apparatus having NA=0.3 and $\sigma$=0.8, light enters the mask at a solid angle of 3.44±2.75 degrees. When a mask having a reduction factor of 4× is used on a wafer, in an exposure apparatus having NA=0.25 and $\sigma$=0.7, light enters the mask at a solid angle of 3.58±2.51 degrees.

As a reflective type mask that deals with inclined incident light, a mask includes a stack of reflective layers, hereinafter referred to as mask blanks, that reflect extreme ultraviolet light, an absorber film that covers the mask blanks with a predetermined pattern and absorbs extreme ultraviolet light, and a buffer film interposed between the mask blanks and the absorber film The mask blanks are constituted by a structure composed of molybdenum (Mo) layers and silicon (Si) layers that are alternately laminated. Generally, the mask blanks are composed of a total of 40 layers of molybdenum layers and silicon layers. When the absorber film that absorbs extreme ultraviolet light is coated in a predetermined pattern on the mask blanks, incident light is selectively reflected corresponding to a circuit pattern, a resist pattern, and so forth that are to be formed. The buffer film is disposed as an etching stopper that prevents the stack of reflective layers from being etched or to avoid being damaged when defects have been removed from the formed absorber film.

When the foregoing reflective type mask is produced, it is necessary to properly decide the film thickness of the absorber film. Conventionally, the film thickness of the absorber film is decided in accordance with an optical density (hereinafter referred to as "OD") of the absorber film, for example, OD=3. The film thickness of the absorber film that satisfies OD=3 is a film thickness that causes the intensity of incident light to be attenuated to $\frac{1}{1000}$. As described in, for example, "Proceedings of SPIE vol. 4343 (2001) pp 409-414 "TaN EUVL Mask Fabrication and Characterization", the value of the OD depends on the reflectance of the surface of the absorber film. The film thickness is decided in accordance with the OD obtained from the reflectance of the surface of the absorber film because a transparent mask that is not capable of dealing with extreme ultraviolet light employs that method.

However, when a reflective type mask dealing with extreme ultraviolet light is used, if the film thickness of the absorber film is decided in accordance with the OD obtained from the reflectance of the surface of the absorber film, the line width variation and the pattern shift to be transferred to a wafer may become large. In the case of the reflective type mask, although the absorber film and the buffer film are formed on the mask blanks that reflect extreme ultraviolet light, the swing effect and the bulk effect may occur on a transferred image on a wafer due to multiple reflections in the absorber film and the buffer film.

More specifically, when the thicknesses of the absorber film and the buffer film are approximately 100 nm and 30 nm, respectively, these thicknesses are larger than a wavelength of 13.5 nm of extreme ultraviolet light, the standing wave effect occurs between extreme ultraviolet light and light reflected by the mask blanks. This standing wave periodically varies the line width and position of the pattern to be transferred to the wafer. In other words, the swing effect, in which the line width and pattern position periodically swing, and the bulk effect, in which they do not periodically vary, occur.

Thus, when the film thickness of the absorber film is decided in accordance with the OD obtained from the reflectance of the surface of the absorber film, the film thickness of the absorber film may be decreased so as to reduce the influence of the light insulating effect of the absorber film (for example, OD=2). However, the foregoing swing effect and bulk effect may cause the line width variation and pattern shift to become too large. As a result, the needs for miniaturizing the pattern width, pattern pitch, and so forth of a transferred image would not be properly satisfied.

Therefore, an object of the present invention is to provide an exposure mask, a method for producing an exposure mask, and a method for producing a semiconductor device, the exposure mask being a reflective type mask being capable of dealing with extreme ultraviolet light, the film thickness of an absorber film being decided so that the line width variation and pattern shift of a pattern exposed on a wafer are at their minimums and so that the exposure mask contributes to the improvement of the performance of a semiconductor device (appropriate address for miniaturization).

DISCLOSURE OF THE INVENTION

To accomplish the foregoing objects, the present invention provides a method for producing an exposure mask. In other words, the present invention provides a method for producing an exposure mask, which is used for exposing an exposure object with the extreme ultraviolet light in a process for producing a semiconductor device, having mask blanks for reflecting extreme ultraviolet light; an absorber film functioning to absorb the extreme ultraviolet light for covering a light reflection plane side of the mask blanks with a predetermined pattern; and a buffer film interposed between the mask blanks and the absorber film. This method includes the steps of specifying the swing effect and bulk effect, which occur on a transferred image on the exposure object due to multiple reflections within the absorber film and the buffer film to at least one fluctuation of a line width and pattern shift in a transferred portion of the predetermined pattern, in accordance with characteristic values of forming materials of the absorber film and the buffer film and optical conditions when exposing, upon deciding the forming film thickness of the absorber film; and deciding an optical density that is a deciding condition of a forming film thickness of the absorber film in consideration of the specified swing effect and the specified bulk effect so that the line width variation of the pattern and/or the pattern shift are at their minimum.

According to the forgoing method for producing the exposure mask, since the optical density as a deciding condition of the forming film thickness of the absorber film is decided in consideration of the swing effect and the bulk effect that occur on the transferred image on the exposure object, when the forming film thickness of the absorber film is decided in accordance with the optical density, unlike the case in which the optical density is only decided in accordance with the reflectance of the surface of the absorber film, even if the swing effect and the bulk effect occur on the transferred image on the exposure object, the forming film thickness of the absorber film can be decided so that the line width variation of the transferred image is at its minimum.

In addition, the present invention provides a method for producing an exposure mask the method including the steps of specifying a swing effect and bulk effect, which occur on a transferred image on an exposure object due to multiple reflections within an absorber film and a buffer film to at least one fluctuation of a line width and pattern shift of a predetermined pattern, in accordance with characteristic values of the forming materials of the absorber film and the buffer film and optical conditions when exposing, upon deciding the forming film thickness of the absorber film; and deciding the forming film thickness of the absorber film in consideration of the specified swing effect, the specified bulk effect, and forming accuracy of the absorber film so that the line width variation of the pattern and/or the pattern shift are at their minimum.

According to the above method for producing an exposure mask when the forming film thickness of the absorber film is decided, since the swing effect and the bulk effect that occur on the transferred image of the exposure object and the film forming accuracy of the absorber film are considered, unlike the case in which the forming film thickness of the absorber film is decided in accordance with the optical density specified from only the reflectance of the surface of the absorber film, even if the swing effect and bulk effect occur on the transferred image of the exposure object or even if the forming film thickness fluctuates due to influence of the film forming accuracy of the absorber film, the forming film thickness of the absorber film can be decided so that the line width variation of the transferred image is at its minimum.

In addition, to accomplish the foregoing object, the present invention provides an exposure mask. In other words, the present invention provides an exposure mask, which is used for exposing an exposure object in a producing process for a semiconductor device, including mask blanks for reflecting exposure light; an absorber film functioning to absorb the exposure light for covering a light reflection plane side of the mask blanks with a predetermined pattern; and a buffer film interposed between the mask blanks and the absorber film, wherein a swing effect and a bulk effect, which occur on a transferred image on the exposure object due to multiple reflections within the absorber film and the buffer film to at least one of fluctuation of a line width and pattern shift of a predetermined pattern are specified in accordance with characteristic values of forming materials of the absorber film and the buffer film and optical conditions when exposing, and wherein an optical density that is a deciding condition of a forming film thickness of the absorber film is decided in consideration of the specified swing effect and the specified bulk effect so that the line width variation of the pattern and/or the pattern shift are at their minimum.

According to the above exposure mask, since the swing effect and the bulk effect that occur on the transferred image on the exposure object are considered in deciding the optical density that is a deciding condition of forming a film thickness of the absorber film, when the forming film thickness of the absorber film is decided in accordance with the optical density, unlike the case in which the forming film thickness of the absorber film is decided in accordance with the optical density specified from only the reflectance of the surface of the absorber film, even if the swing effect and bulk effect occur on the transferred image of the exposure object, the forming film thickness of the absorber film can be decided so that the line width variation of the transferred image is at its minimum.

In addition, the exposure mask of the present invention is used for exposing an exposure object in a producing process for a semiconductor device and includes mask blanks for reflecting exposure light; an absorber film functioning to absorb the exposure light for covering a light reflection plane side of the mask blanks with a predetermined pattern; and a buffer film interposed between the mask blanks and the absorber film, wherein a swing effect and a bulk effect, which occur on a transferred image on the exposure object due to multiple reflections within the absorber film and the buffer film to at least one of fluctuation of a line width and pattern shift in a transferred portion of the predetermined pattern are specified in accordance with characteristic values of forming materials of the absorber film and the buffer film and optical conditions when exposing, and wherein a forming film thickness of the absorber film is decided in consideration of the specified swing effect, the specified bulk effect, and the film forming accuracy of the absorber film so that the line width variation of the pattern and/or the pattern shift are at their minimum.

According to the exposure mask structured above, when the forming film thickness of the absorber film is decided, since the swing effect and the bulk effect that occur on the transferred image on the exposure object and the film forming accuracy of the absorber film are considered to decide the forming film thickness of the absorber film, unlike the case in which the forming film thickness of the absorber film is decided in accordance with the optical density specified from only the reflectance of the surface of the absorber film, even if the swing effect and bulk effect occur on the transferred image on the exposure object or even if the forming film thickness fluctuates due to influence of the film forming accuracy of the absorber film, the forming film thickness of the absorber film can be decided so that the line width variation of the transferred image becomes minimal.

In addition, the present invention provides a method for producing a semiconductor device. In other words, the present invention provides a method for producing a semiconductor device, including the step of providing an exposure mask having mask blanks for reflecting exposure light; an absorber film functioning to absorb the exposure light for covering a light reflection plane side of the mask blanks with a predetermined pattern; and a buffer film interposed between the mask blanks and the absorber film; the exposure mask being produced by a method having the steps of specifying a swing effect and a bulk effect, which occur on an transferred image on the exposure object due to multiple reflections in the absorber film and the buffer film to at least one fluctuation of a line width and pattern shift in a transferred portion of the predetermined pattern, in accordance with characteristic values of forming materials of the absorber film and the buffer film and optical conditions for exposing, upon deciding the forming film thickness of the absorber film; and deciding an optical density that is a deciding condition of a forming film thickness of the absorber film in consideration of the specified swing effect and the specified bulk effect so that the line width variation of the pattern and/or the pattern shift are at their minimum; and exposing the exposure object with the exposure mask using exposure light having the same wavelength as the exposure light used by the method for producing the exposure mask.

According to the forgoing method for producing the semiconductor device, at the exposing step for exposing the exposure object, since the optical density as a deciding condition of the forming film thickness of the absorber film is decided in consideration of the swing effect and the bulk effect that occur on the transferred image on the exposure object, when the forming film thickness of the absorber film is decided in accordance with the optical density, unlike the case in which the optical density is decided in accordance with only the reflectance of the surface of the absorber film, even if the swing effect and the bulk effect occur on the transferred image on the exposure object, the forming film thickness of the absorber film can be decided so that the line width variation of the transferred image is at its minimum.

In addition, the present invention provides a method for producing a semiconductor device, including the step of providing an exposure mask having mask blanks for reflecting exposure light; an absorber film functioning to absorb the exposure light for covering a light reflection plane side of the mask blanks with a predetermined pattern; and a buffer film interposed between the mask blanks and the absorber film; the exposure mask being produced by a method having the steps of specifying a swing effect and a bulk effect, which occur on a transferred image on the exposure object due to multiple reflections in the absorber film and the buffer film to at least one fluctuation of a line width pattern shift in a transferred portion of the predetermined pattern in accordance with characteristic values of forming materials of the absorber film and the buffer film and optical conditions when exposing, upon deciding the forming film thickness of the absorber film; and deciding a forming film thickness of the absorber film in consideration of the specified swing effect, the specified bulk effect, and a forming accuracy of the absorber film so that the line width variation of the pattern and/or the pattern shift are at their minimum; and exposing the exposure object with the exposure mask using exposure light having the same wavelength as the exposure light used by the method for producing the exposure mask.

According to the method for producing the semiconductor device, when the forming film thickness of the absorber film of the exposure mask is decided, since the swing effect and the bulk effect that occur on the transferred image of the exposure object and the film forming accuracy of the absorber film are considered, at the exposing step for exposing the exposure object, unlike the case in which the forming film thickness of the absorber film is decided in accordance with the optical density specified from only the reflectance of the surface of the absorber film, even if the swing effect and bulk effect occur on the transferred image of the exposure object or even if the forming film thickness fluctuates due to an influence of the film forming accuracy of the absorber film, the forming film thickness of the absorber film can be decided so that the line width variation of the transferred image is at its minimum.

BEST MODE FOR CARRYING OUT THE INVENTION

Next, with reference to the accompanying drawings, a method for producing an exposure mask, an exposure mask, and a method for producing a semiconductor device according to the present invention will be described. It should be noted that the present invention is not limited to the following embodiments.

Figure 1:
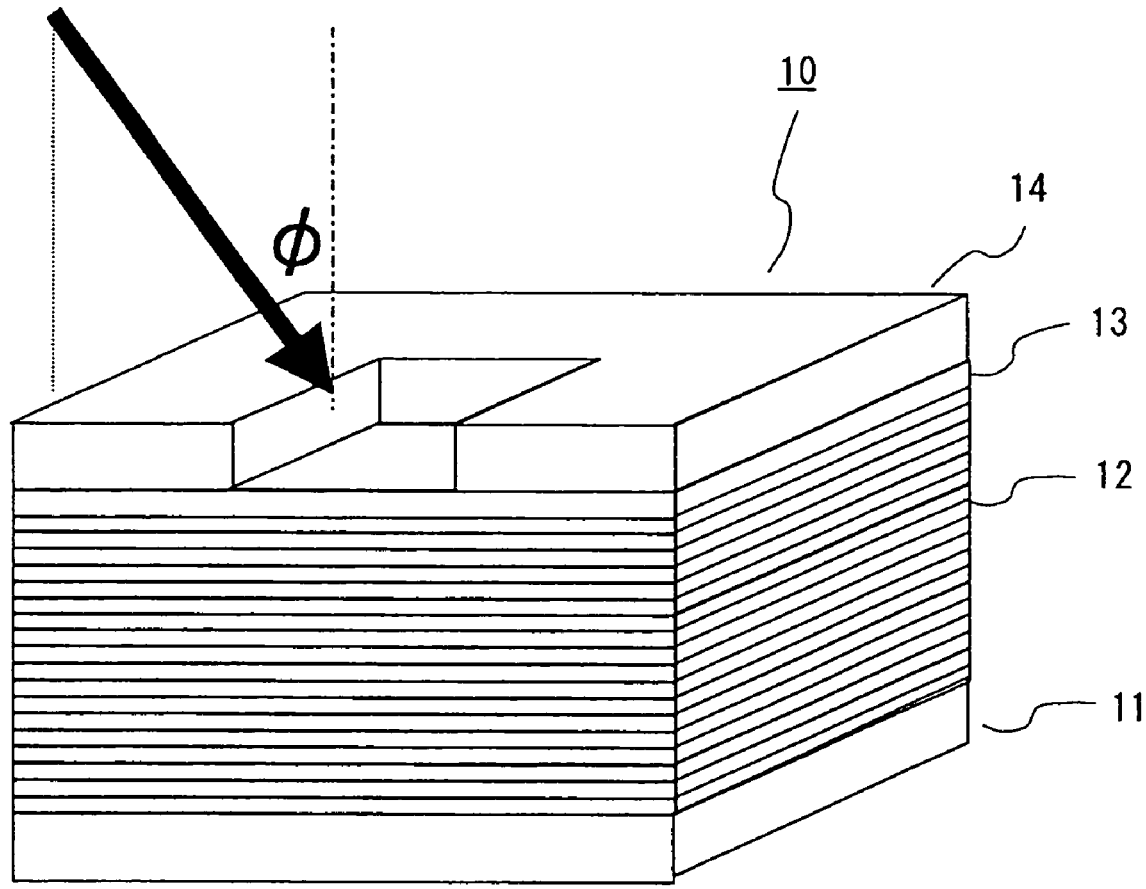
FIG. 1 is a perspective view showing an example of an outlined structure of an exposure mask according to the present invention.

First of all, a structure of an exposure mask according to the present invention will be described. FIG. 1 is a perspective view showing an example of an outlined structure of the exposure mask according to the present invention. As shown in the figure, an exposure mask 10 is composed of mask blanks 12 of which a total of 40 layers of Mo layers and Si layers are alternately laminated on, for example, a silicon dioxide ($SiO_2$) glass 11; a buffer film 13 made of ruthenium (Ru) (hereinafter referred to as "Ru film"); and an absorber film 14 made of tantalum nitride (TaN) as a material of absorbing extreme ultraviolet light (hereinafter referred to as "TaN film").

The characteristic values of the forming materials of those films constituting the exposure mask 10 are as follows. The film thicknesses of the Mo layer and the Si layer constituting the mask blanks 12 are 2.789 nm and 4.184 nm, respectively. The film thickness of the Ru film 13 is 30 nm satisfy the function as a buffer film. The refractive indexes of the forming materials are as follows:

$SiO_2$=0.9781727−0.0107731i,
Mo=0.9210839−0.00643543i,
Si=0.999319676−0.00182645i,
Ru=0.887487−0.0174721i,
TaN=0.9413643−0.0315738i where i is an imaginary unit.

An optical condition when exposure is performed with the exposure mask 10 is as follows. In other words, an exposure wavelength is 13.5=n. The exposing conditions are NA=0.25 and σ=0.70.

To produce the above exposure mask 10, it is necessary to properly decide a film thickness of the TaN film 14. The present invention features a process for deciding the film thickness of the TaN film 14.

Figure 2:
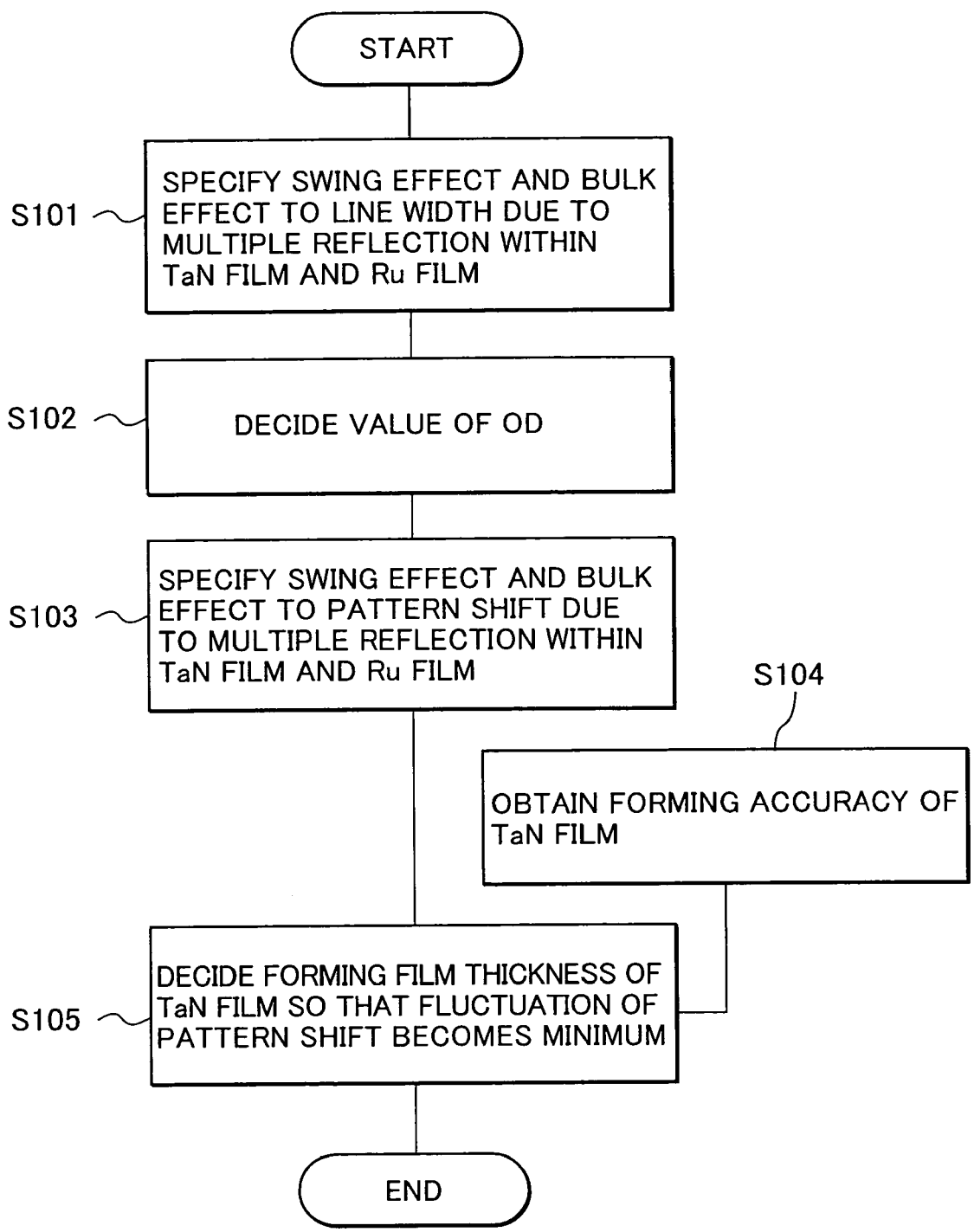
FIG. 2 is a flow chart showing an example of a process for deciding a film thickness of a TaN film of the exposure mask according to the present invention.

The decision process will be described in brief. FIG. 2 is a flow chart showing an example of the film thickness decision process according to the present invention. As shown in the figure, when a forming film thickness of the absorber film 14 is decided, the swing effect and the bulk effect that occur on a transferred image of a pattern formed with the TaN film 14 are specified (at step 101, hereinafter step is abbreviated as "S"). In this example, the swing effect and the bulk effect that occur against a line width of the transferred image (pattern width) are specified. The swing effect and bulk effect occur due to the influence of the TaN film 14 and the Ru film 13. Thus, the swing effect and the bulk effect can be specified by, for example, a logical calculation, a simulation, or the like in accordance with the characteristic values of the forming materials of the TaN film 14 and the Ru film 13 and exposure optical conditions.

After the swing effect and the bulk effect that occur against a line width are specified, the OD as the decision condition of the forming film thickness of the TaN film 14 is decided in consideration of the specified swing effect and bulk effect so that the line width variation is at its minimum (at S102). Thus, the forming film thickness of the TaN film 14 can be estimated. In other words, the reference of the forming film thickness of the TaN film 14 is decided.

However, this does not mean that the film thickness of the TaN film 14 can be freely specified in accordance with the decided OD. After the OD has been decided, the swing effect and the bulk effect are specified (at S103). In particular, the swing effect and the bulk effect against a pattern shift of a transferred image are specified. They are specified in the same manner as those against a line width. On the other hand, the film forming accuracy of the TaN film 14 that depends on the performance of a film forming apparatus forming the TaN film 14 is obtained (at S104). Thus, the fluctuation of the forming film thickness of the TaN film 14 can be estimated.

Thereafter, the forming film thickness of the TaN film 14 is decided in consideration of the specified swing effect and bulk effect and the film forming accuracy of the TaN film 14 so that the pattern shift is at its minimum (at S105). Thus, the forming film thickness of the TaN film 14 in which the line width variation and the pattern shift are at their minimum is decided.

Next, a concrete example of the forgoing decision process will be described. First of all, specifying the swing effect and bulk effect due to multiple interferences in the TaN film 14 and the Ru film 13 will be described (at S101 in FIG. 2). As described above, the swing effect and bulk effect are specified by, for example, a theoretical calculation, simulation, or the like in accordance with the characteristic values of the forming materials of the TaN film 14 and Ru film 13 and the exposure optical conditions. Since these methods can be performed by known techniques, their description will be omitted.

Figure 3:
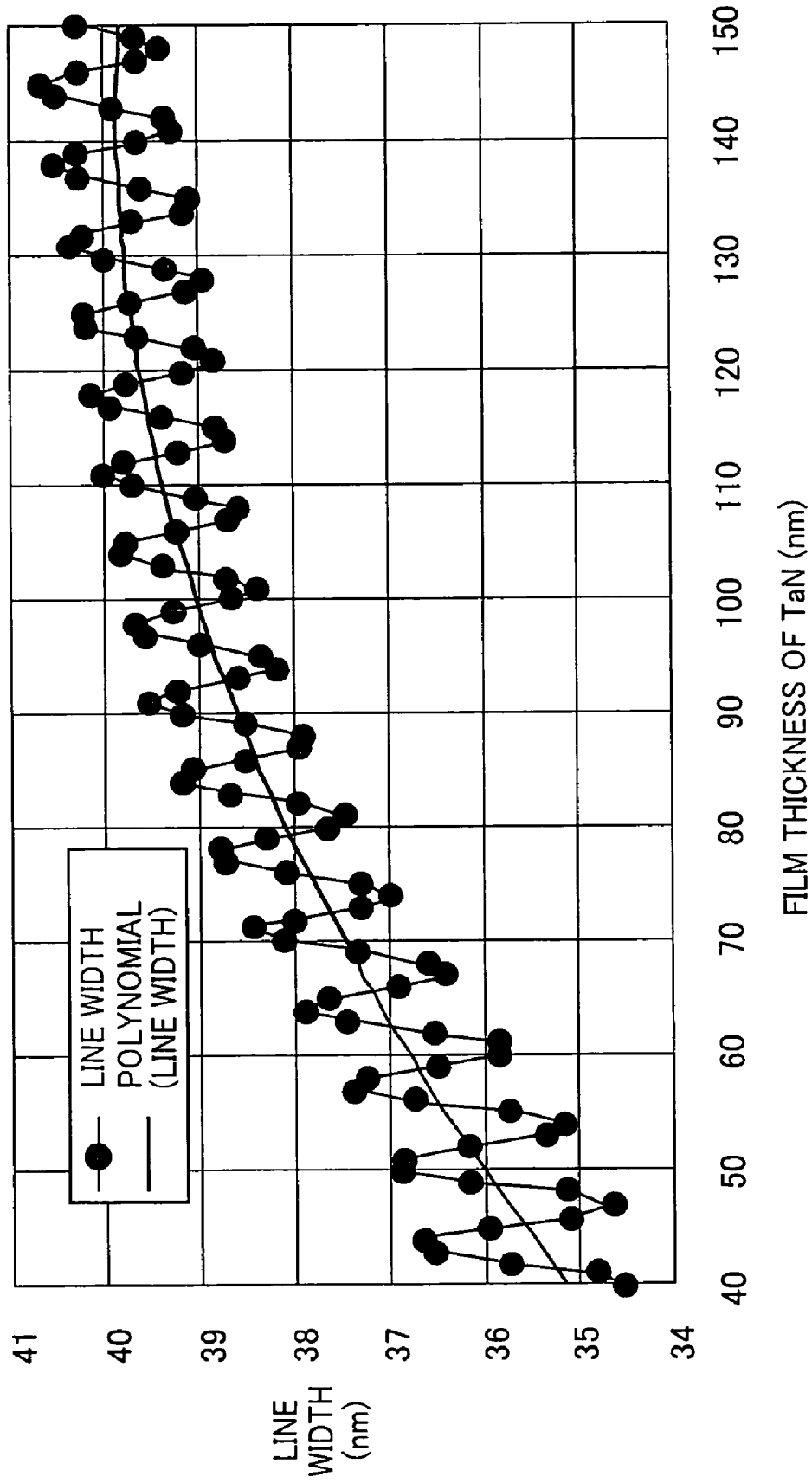
FIG. 3 is a schematic diagram describing a concrete example of the swing effect and the bulk effect with plotted values against a line width for a film thickness of a TaN film in the case that a pattern having a width of 40 nm is formed on a mask (on a wafer: 160 nm on a 4× mask).
Figure 4:
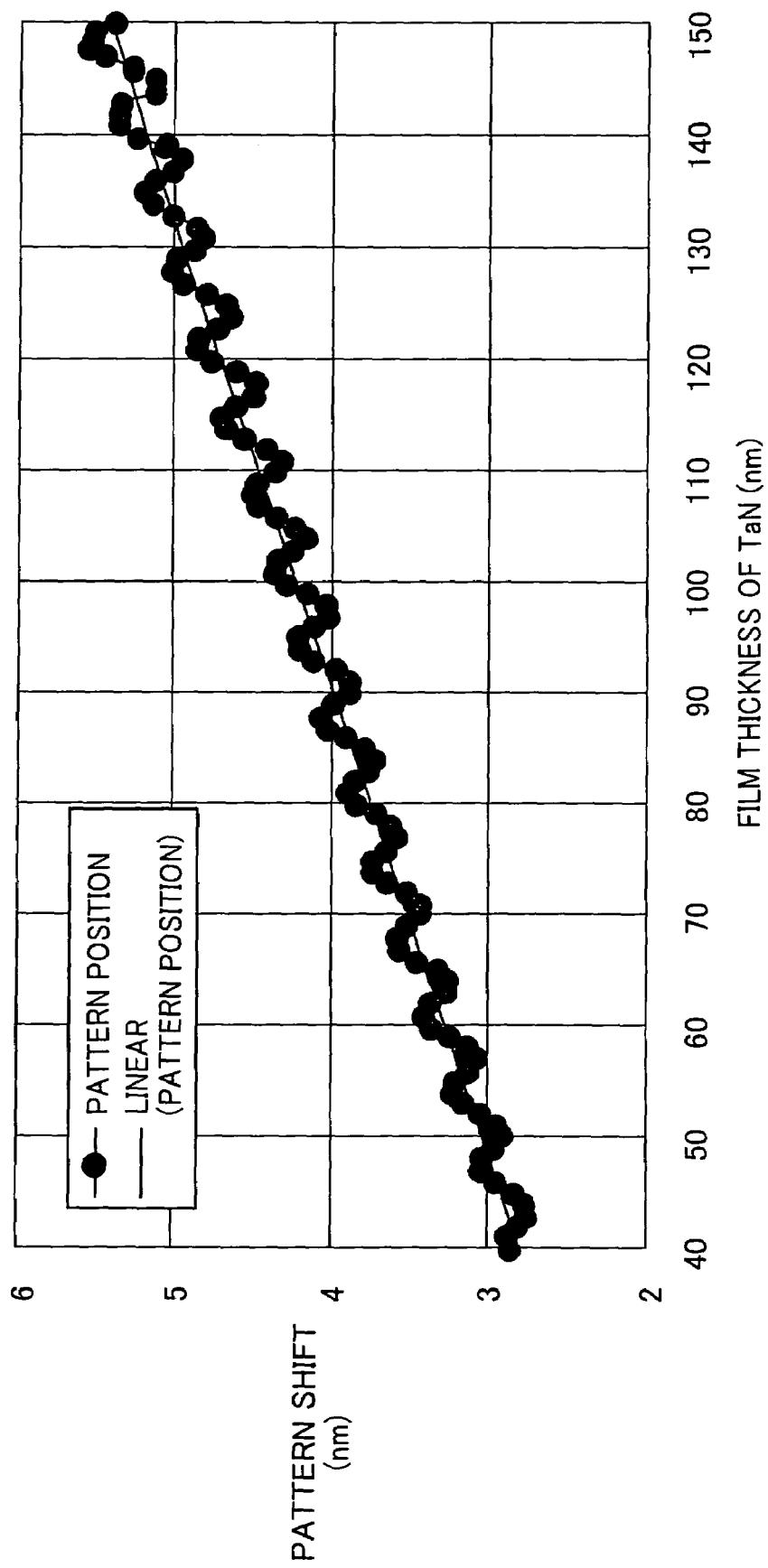
FIG. 4 is a schematic diagram describing a concrete example of the swing effect and the bulk effect with plotted values against a pattern shift for a film thickness of a TaN film in the case that a pattern having a width of 40 nm is formed on a mask (on a wafer: 160 nm on a 4× mask).
Figure 5:
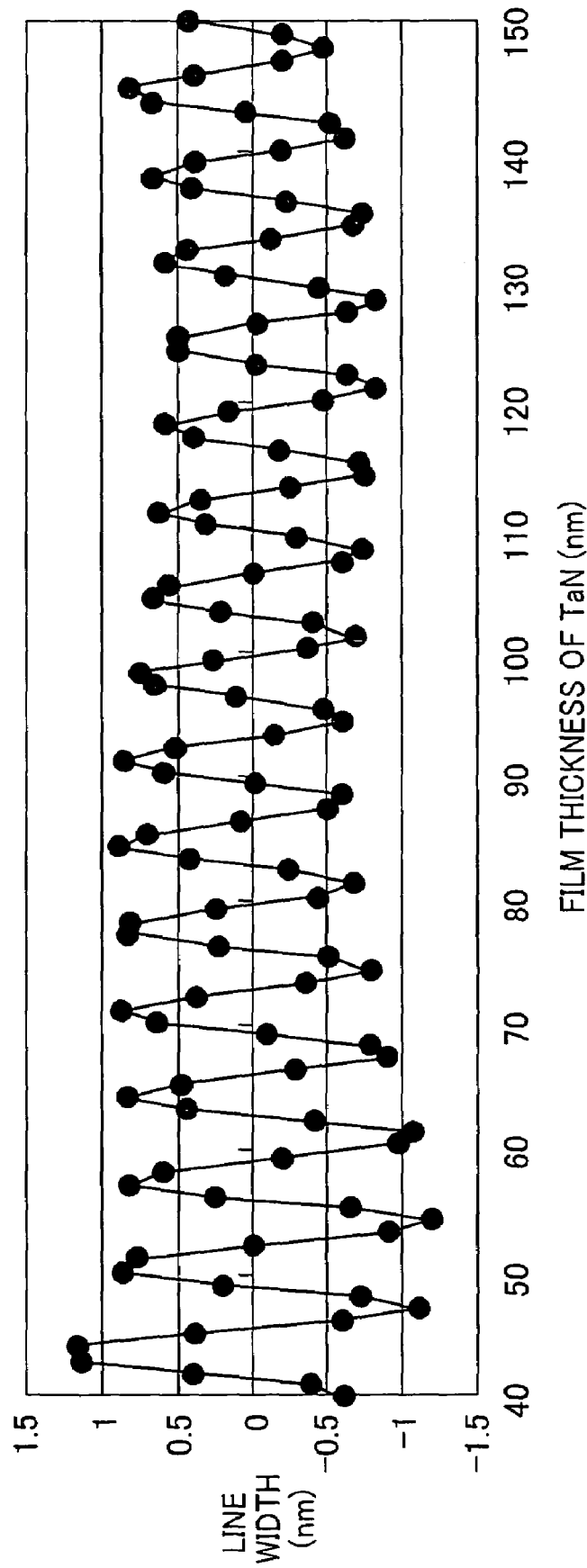
FIG. 5 is a schematic diagram describing a concrete example of only the swing effect with plotted values against a line width for a film thickness of a TaN film in the case that a pattern having a width of 40 nm is formed on a mask (on a wafer: 160 nm on a 4× mask).
Figure 6:
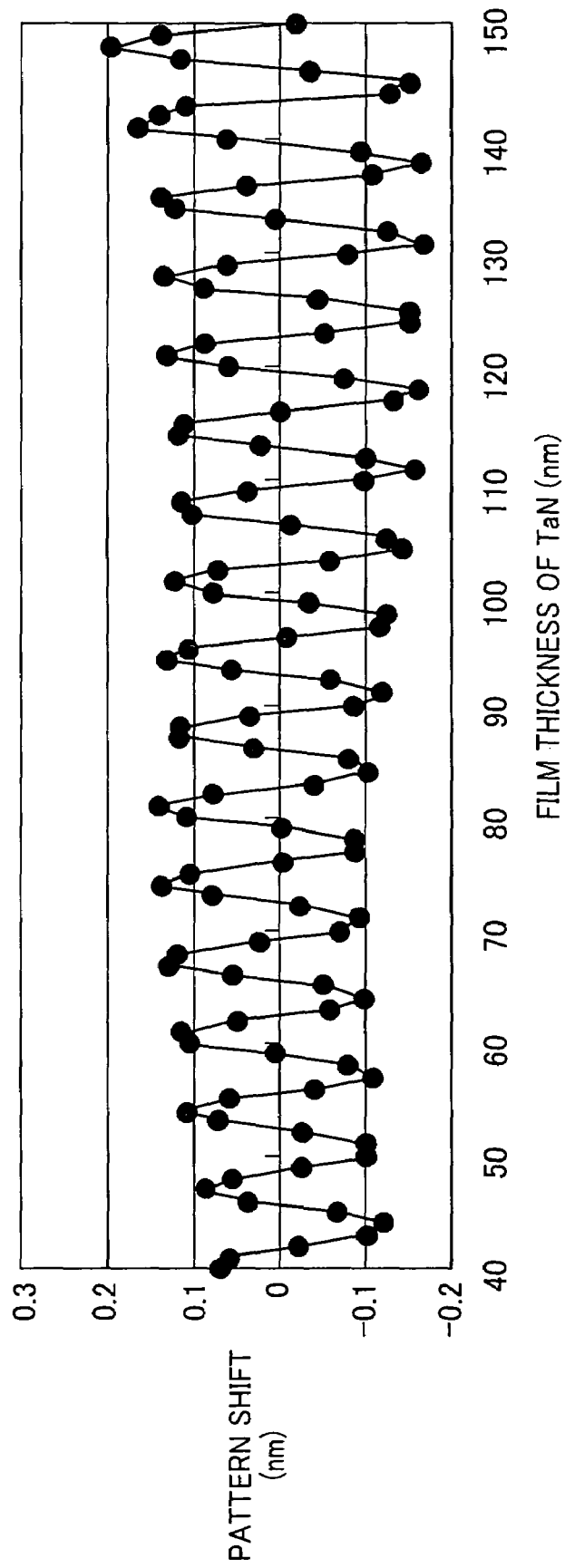
FIG. 6 is a schematic diagram describing a concrete example of only the swing effect with plotted values against pattern shift for a film thickness of a TaN film in the case that a pattern having a width of 40 nm is formed on a mask (on a wafer: 160 nm on a 4× mask).

FIG. 3 to FIG. 6 are schematic diagrams describing concrete examples of specified results of the swing effect and the bulk effect. In these examples, assuming that the film thickness of the Ru film 13 is 30 nm, the swing effect and the bulk effect are specified. FIG. 3 shows the swing effect and the bulk effect with plotted values against a line width for a film thickness of the TaN film 14 in the case that a pattern having a width of 40 nm is formed on a mask (on a wafer: 160 nm on a −4× mask). The pattern pitch is 160 nm and the incident angle against the normal line of the mask surface is 4.84 degrees. In the drawing, an approximated curve line against the line width represents the bulk effect against the line width. FIG. 4 shows the swing effect and the bulk effect with plotted values against a pattern shift for a film thickness of the TaN film 14 in the case that a pattern having a width of 40 nm is formed on a mask (on a wafer: 160 nm on a 4× mask). In the drawing, an approximate straight line against the pattern shift represents the bulk effect against the pattern shift. FIG. 5 shows only the swing effect with plotted values against a line width for a film thickness of the TaN film 14 in the case that a pattern having a width of 40 nm is formed on a mask (on a wafer: 160 nm on a −4× mask) with OD=around 3. FIG. 6 shows only the swing effect with plotted values against the pattern shift for a film thickness of the TaN film 14 in the case that a pattern having a width of 40 nm is formed on a mask (on a wafer: 160 nm on a −4× mask) with OD=around 3.

As is clear from FIG. 3 to FIG. 6, the swing effect and bulk effect, that are the specified result, vary as the film thickness of the TaN film 14 increases as follows. In other words, the swing effect against a line width gradually decreases as the film thickness of the TaN film 14 increases (see FIG. 3 and FIG. 5). In contrast, the swing effect against the pattern shift gradually increases as the film thickness of the TaN film 14 increases (see FIG. 4 and FIG. 6). In addition, the bulk effect against a line width decreases, as the film thickness of the TaN film 14 increases, by a quadratic curve so as to be preferably approached (see FIG. 3). In contrast, the bulk effect against the pattern shift is constant regardless of the film thickness of the TaN film 14 so as to be preferably approached by a linear curve (see FIG. 4).

Figure 7:
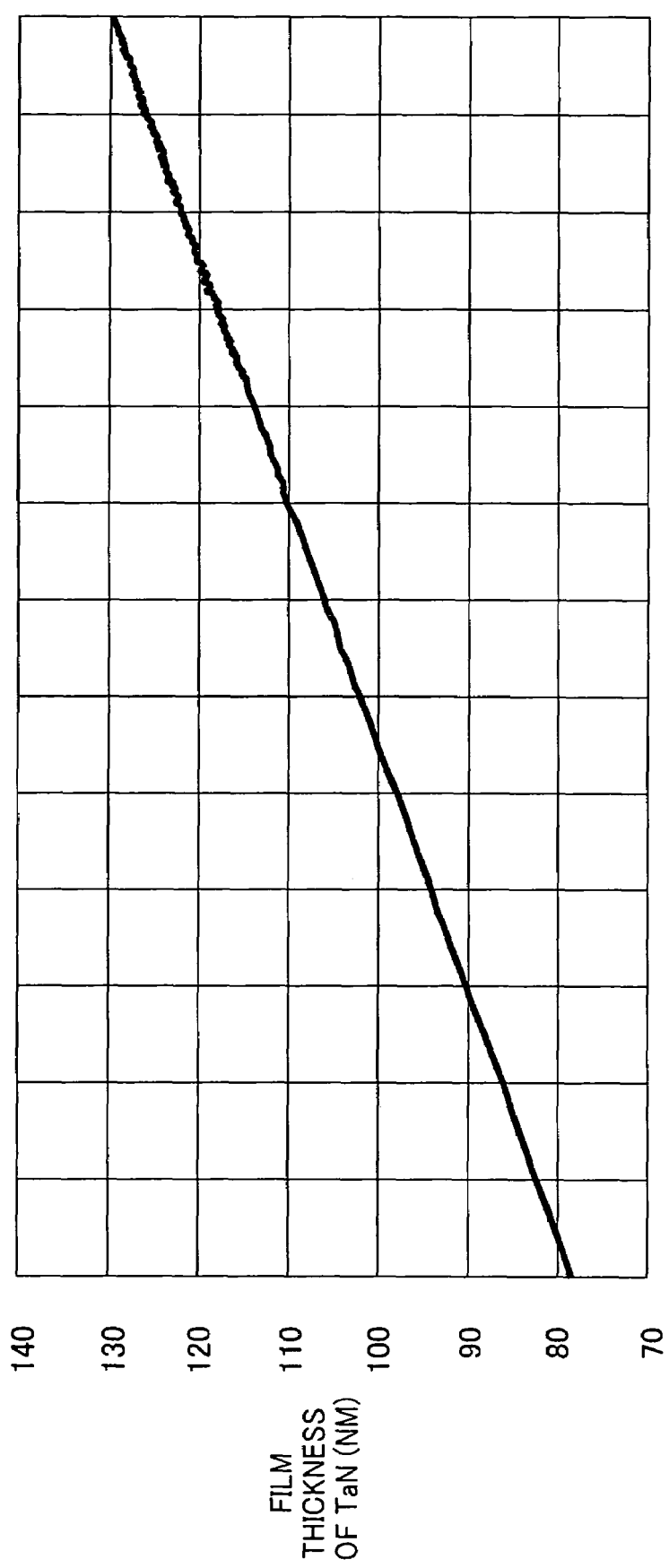
FIG. 7 is a schematic diagram describing a concrete example of the relation of an OD and a film thickness of a TaN film.

Next, the OD that is decided in accordance with the specified swing effect and bulk effect will be described (S102 shown in FIG. 2). The OD is decided in accordance with the swing effect and bulk effect against a line width (see FIG. 3 and FIG. 5). The OD is a deciding condition of the forming film thickness of the TaN film 14. The OD has a relation with the film thickness of the TaN film 14 as shown in FIG. 7. FIG. 7 is a schematic diagram describing a concrete example of the relation of the OD and the film thickness of the TaN film 14.

As described above, conventionally, the value of the OD was decided with only the reflectance on the surface of the TaN film 14 (absorber film) without consideration of the swing effect and bulk effect. Thus, it was thought that even if OD=2, a good pattern can be formed. FIG. 7 shows that with OD=3 the film thickness of the TaN film 14 is around 120 nm, and with OD=2 the film thickness of the TaN film 14 is around 80 nm. However, when the forming film thickness of the TaN film 14 fluctuates due to the influence of the film forming accuracy, as is clear from the relation between the fluctuation of the film thickness and the line width variation, the range of the line width variation of the transferred line with OD=2 is larger than that with OD=3.

Thus, the OD is decided in consideration of the swing effect and bulk effect against a line width (see FIG. 3 and FIG. 5) so that the line width variation is at its minimum. More specifically, it is found that the range of the line width variation of the transferred line with OD=3 is preferably smaller than that with OD=2. Thus, it is decided that, for example, OD=3. The forming film thickness of the TaN film 14 is decided with a reference of OD=3.

The film thickness of the TaN film 14 can be decided in accordance with only the OD decided as above (see FIG. 3). However, since the film thicknesses of the TaN film 14 and the Ru film 13 fluctuate in predetermined ranges due to the influence of the film forming accuracies thereof, it is not mean that the film thickness of the TaN film 14 can be freely specified in accordance with the decided OD. Instead, it is thought that an optimum portion exists for a good transferred image.

Figure 8:
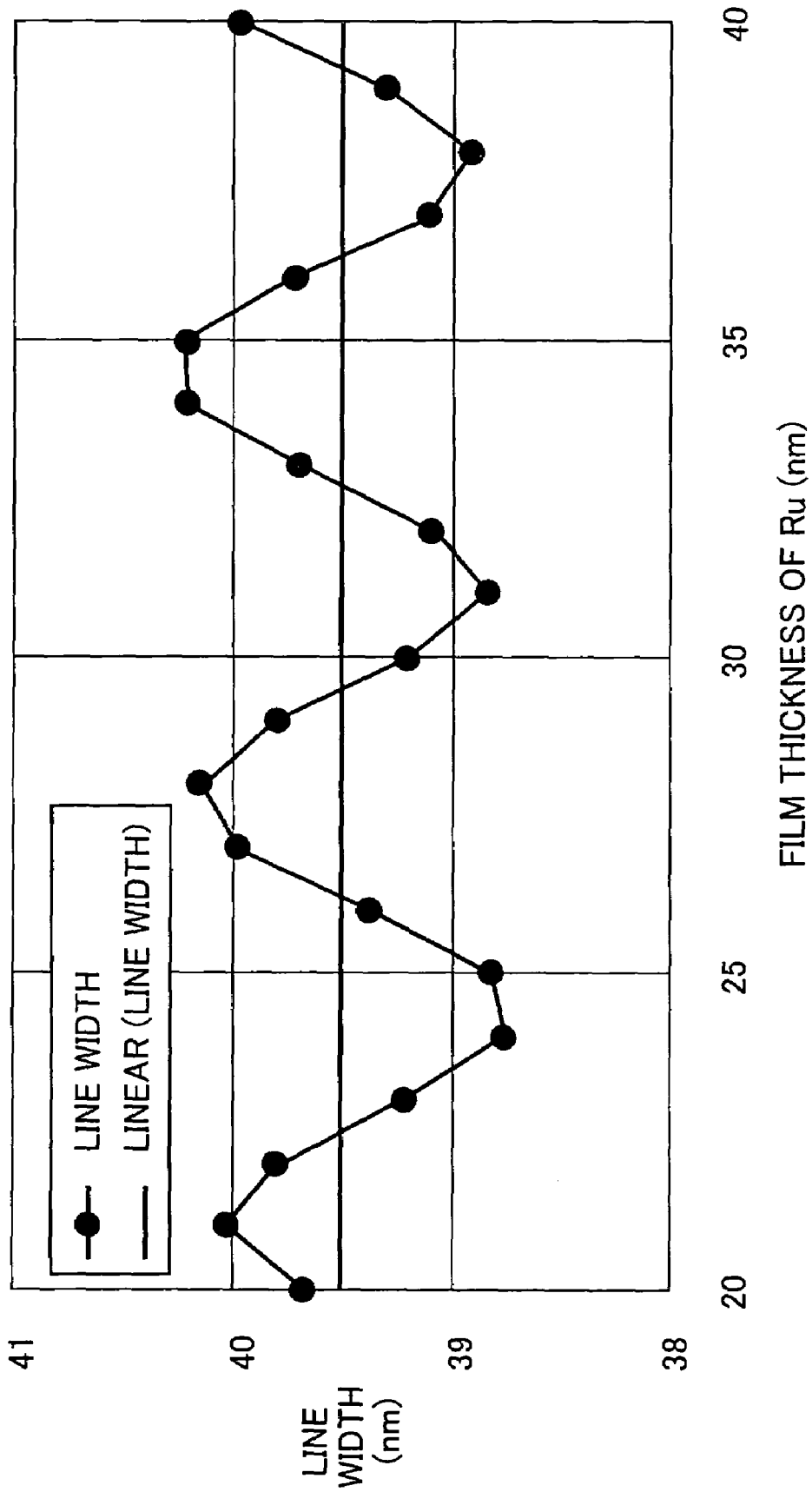
FIG. 8 is a schematic diagram describing a concrete example of the swing effect and the bulk effect with plotted values against a line width in the case that a pattern having a width of 40 nm is formed on a mask (on a wafer: 160 nm on a 4× mask) and that a film thickness of a TaN film is fixed and a film thickness of a Ru film is varied with an OD of around 3.
Figure 9:
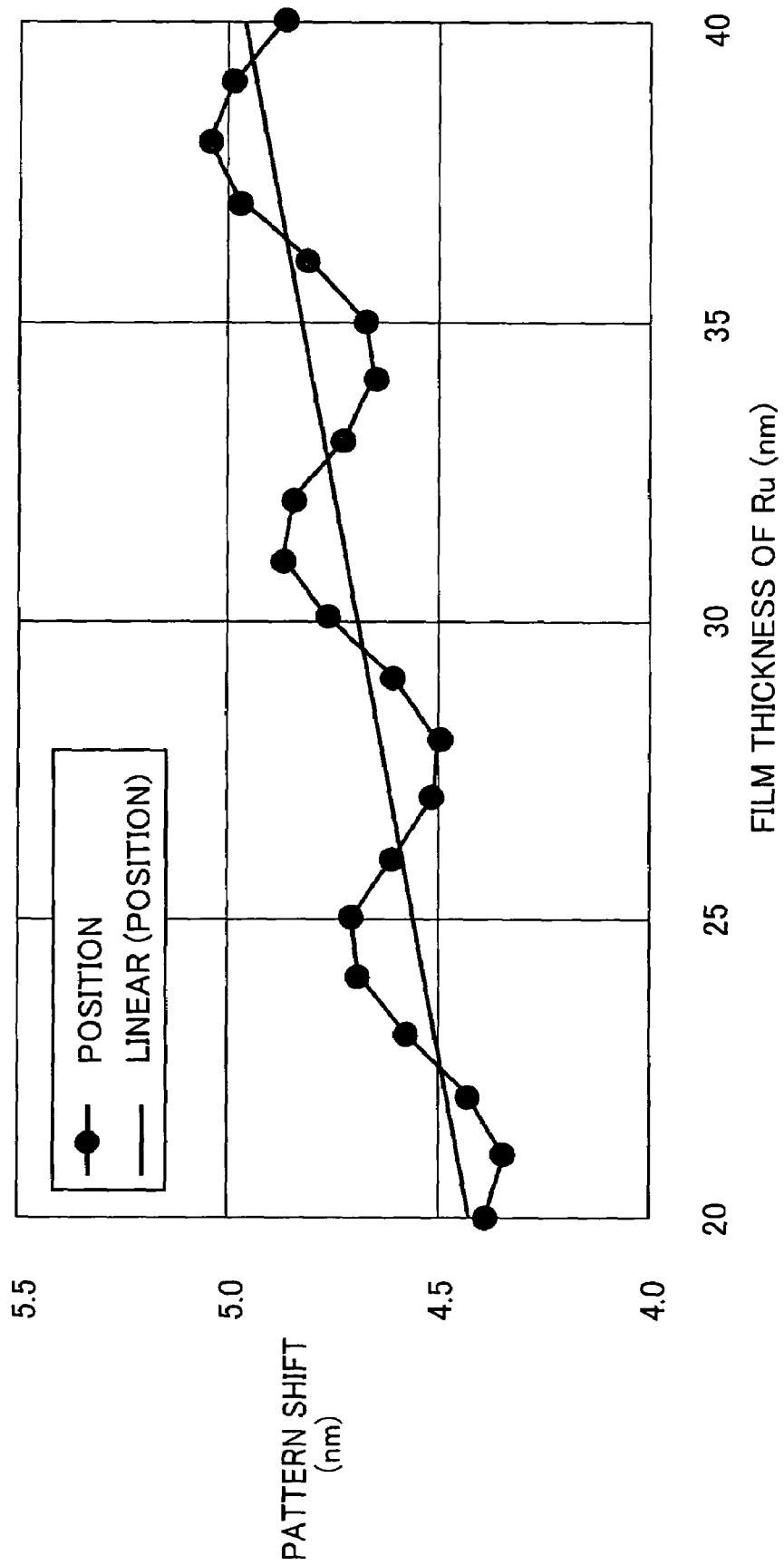
FIG. 9 is a schematic diagram describing a concrete example of the swing effect and the bulk effect with plotted values against a pattern shift in the case that a pattern having a width of 40=n is formed on a mask (on a wafer: 160 nm on a 4× mask) and that a film thickness of a TaN film is fixed and a film thickness of a Ru film is varied with an OD of around 3.

FIG. 8 is a schematic diagram describing the swing effect and the bulk effect with plotted values against a line width in the case that a pattern having a width of 40 n is formed on a mask (on a wafer: 160 nm on a 4× mask) and that the film thickness of the TaN film 14 is fixed and the film thickness of the Ru film 13 is varied with the OD of around 3. FIG. 9 is a schematic diagram describing the swing effect and the bulk effect with plotted values against a pattern shift in the case that a pattern having a width of 40 nm is formed on a mask (on a wafer: 160 nm on a 4× mask) and that the film thickness of the TaN film 14 is fixed and the film thickness of the Ru film 13 is varied with the OD of around 3. It is found from these drawings that the swing effect against a line width, the swing effect against pattern shift, the bulk effect against a line width, and the bulk effect against pattern shift occur when the film thickness of the Ru film 13 is varied like those when the film thickness of the TaN film 14 is varied.

Figure 10:
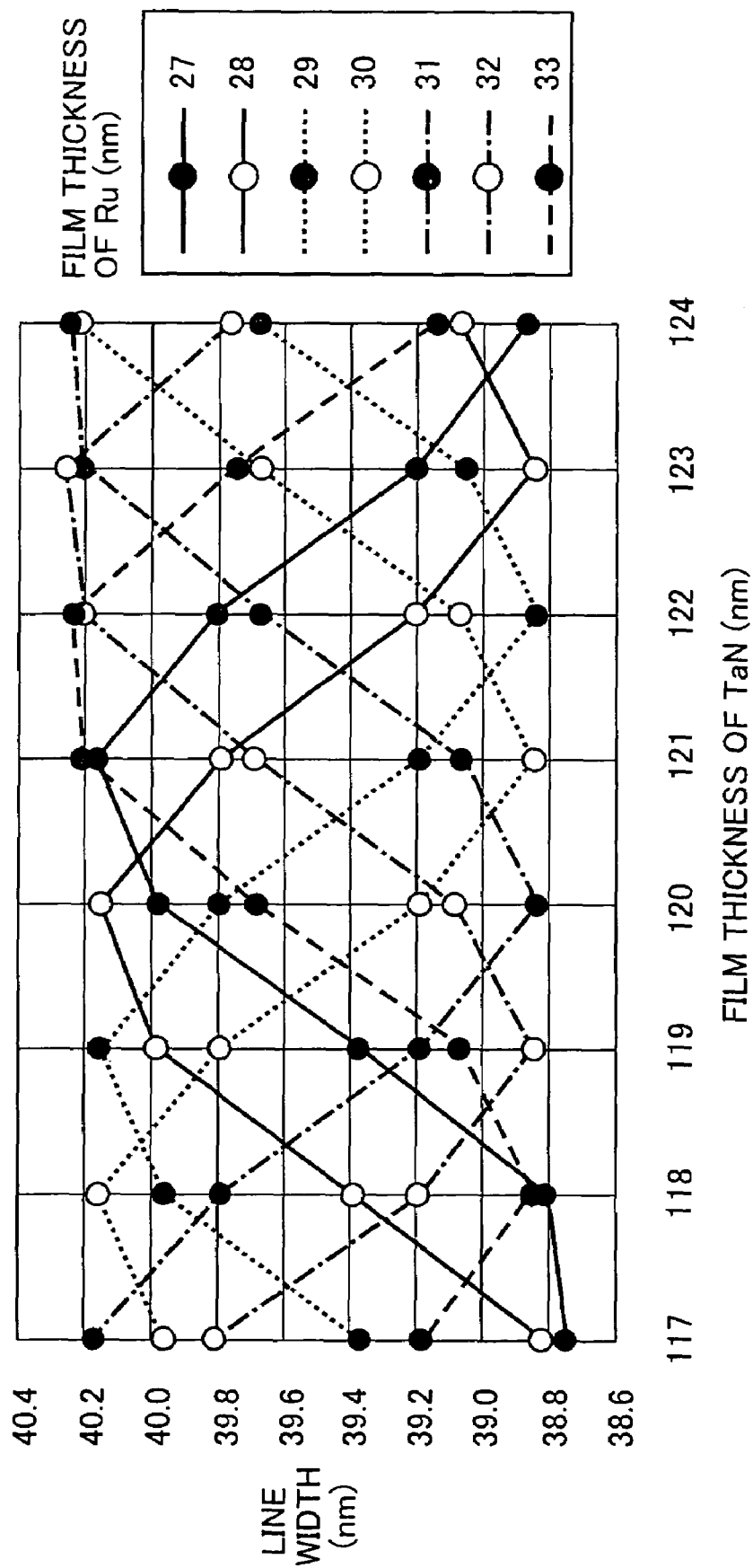
FIG. 10 is a schematic diagram describing a concrete example of the swing effect and the bulk effect with plotted values against a line width in the case that a pattern having a width of 40 nm is formed on a mask (on a wafer: 160 nm on a 4× mask) and that film thicknesses of a TaN film and a Ru film are varied with an OD of around 3.
Figure 11:
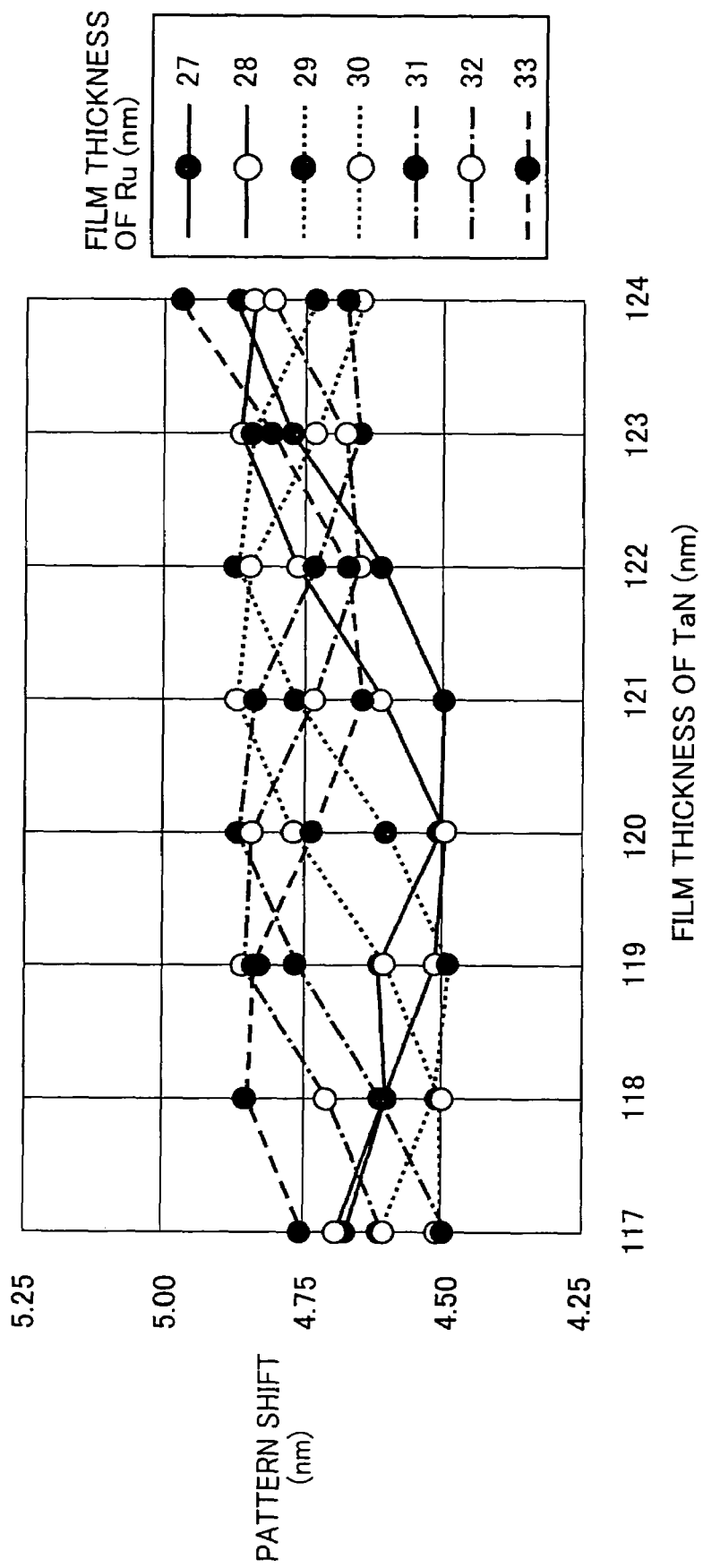
FIG. 11 is a schematic diagram describing a concrete example of the swing effect and the bulk effect with plotted values against a pattern shift in the case that a pattern having a width of 40 nm is formed on a mask (on a wafer: 160 nm on a 4× mask) and that film thicknesses of a TaN film and a Ru film are varied with an OD of around 3.

FIG. 10 is a schematic diagram describing the swing effect and the bulk effect with plotted values against a line width in the case that a pattern having a width of 40 nm is formed on a mask (on a wafer: 160 nm on a 4× mask) and that film thicknesses of the TaN film 14 and the Ru film 13 are varied. FIG. 11 is a schematic diagram describing the swing effect and the bulk effect with plotted values against a pattern shift in the case that a pattern having a width of 40 nm is formed on a mask (on a wafer: 160 nm on a 4× mask) and that the film thicknesses of both the TaN film 14 and the Ru film 13 are varied. It is found from FIG. 10 that when the forming fluctuation of the film thickness of the TaN film 14 is, for example, ±3 nm and the forming fluctuation of the film thickness of the Ru film 13 is, for example, ±3 nm, the line width variation due to the influence of these fluctuations of the film thickness is around 1.4 nm On the other hand, FIG. 11 shows that since the influence of the bulk effect due to the film thicknesses of the TaN film 14 and the Ru film 13 is large, the pattern shift has a node when the film thickness of the TaN film 14 is around 123 nm and has a loop when it is not 123 nm.

Since there are a node and a loop, it can be said that there is an optimum portion of the film thickness of the TaN film 14 for obtaining a good transferred image when the forming film thicknesses of the TaN film 14 and the Ru film 13 fluctuate. Thus, after the OD has been decided, a process for obtaining the optimum portion of the TaN film 14 is performed in consideration of the fluctuation of the film thickness of the Ru film 13 (at S103 to S105 shown in FIG. 2).

To obtain the optimum portion of the film thickness, the swing effect and the bulk effect are specified (at S103 shown in FIG. 2). The method for specifying the swing effect and the bulk effect is the same as the foregoing method (at S101 shown in FIG. 2).

Figure 12:
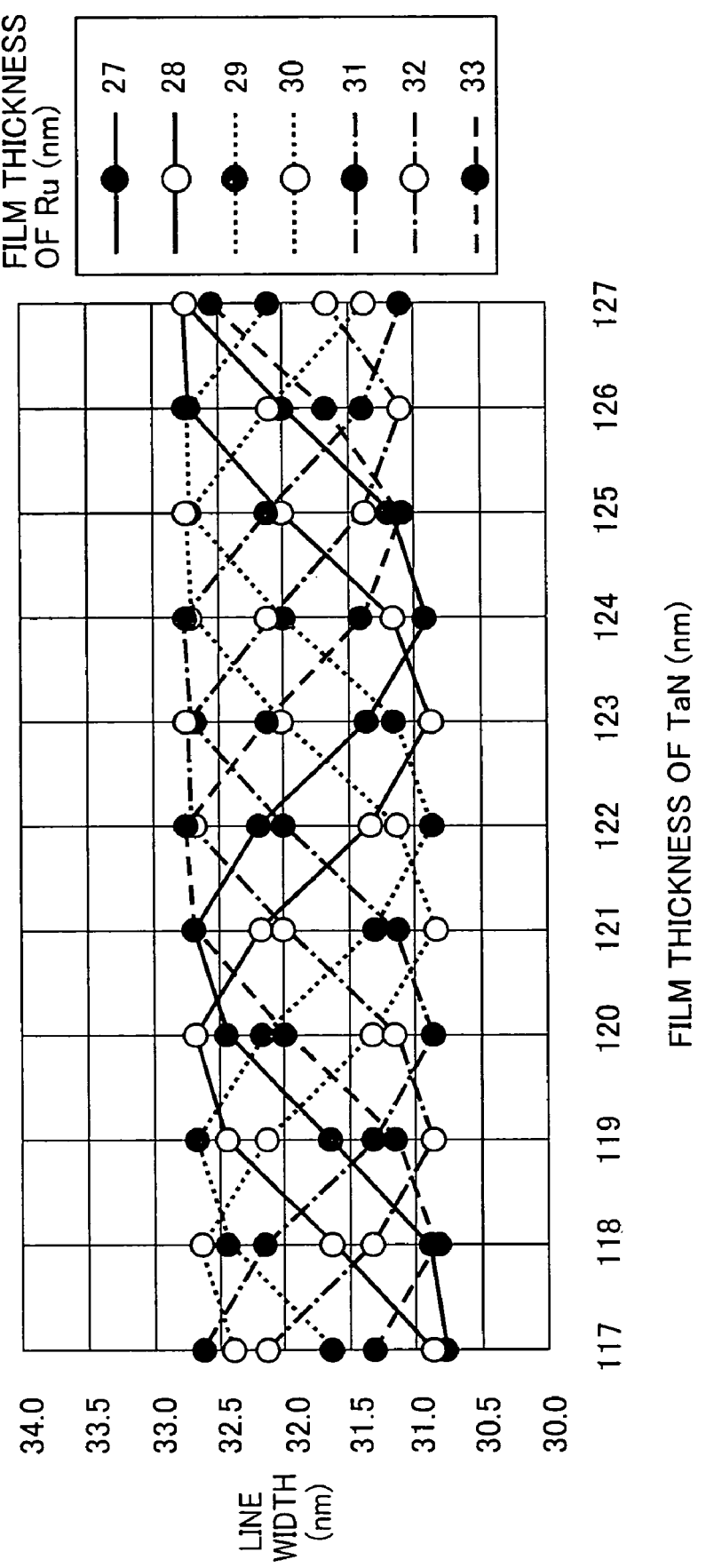
FIG. 12 is a schematic diagram describing a concrete example of the swing effect and the bulk effect with plotted values against a line width in the case that a pattern having a width of 30 nm is formed on a mask (on a wafer: 120 nm on a 4× mask) and a film thicknesses of a TaN film and a Ru film are varied at an incident angle of 4.84 degrees.
Figure 13:
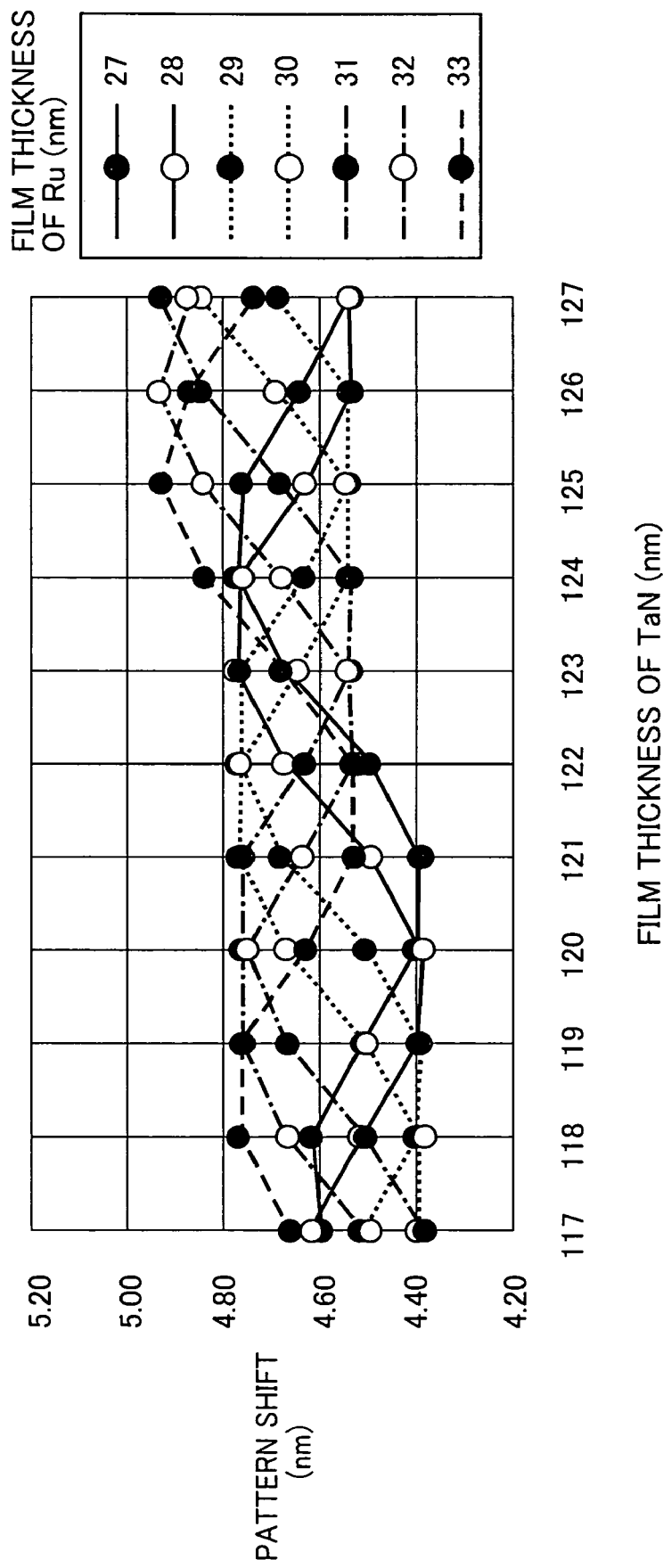
FIG. 13 is a schematic diagram describing a concrete example of the swing effect and the bulk effect with plotted values against a pattern shift in the case that a pattern having a width of 30 nm is formed on a mask (on a wafer: 120 nm on a 4× mask) and a film thicknesses of a TaN film and a Ru film are varied at an incident angle of 4.84 degrees.
Figure 14:
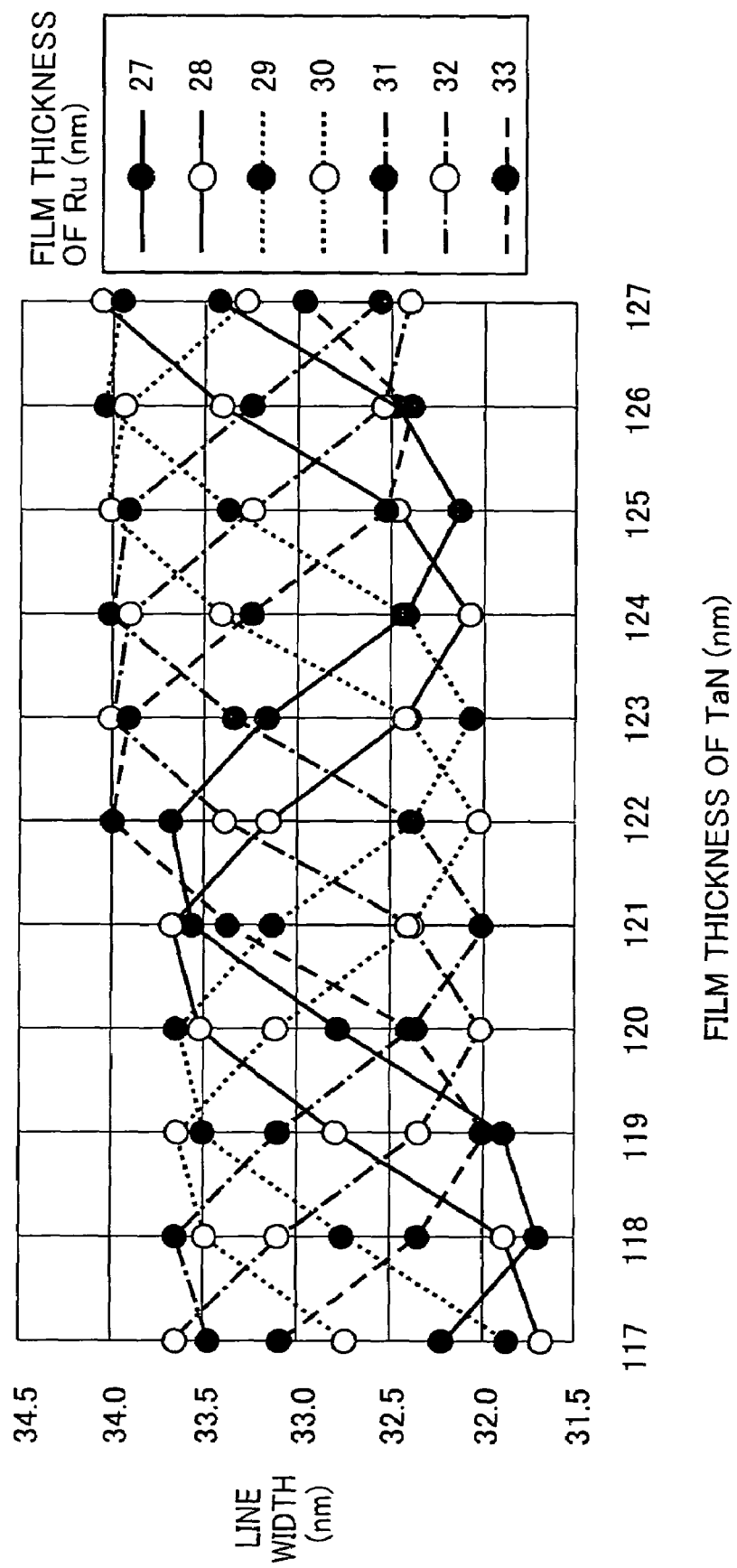
FIG. 14 is a schematic diagram describing a concrete example of the swing effect and the bulk effect with plotted values against a line width in the case that a pattern having a width of 30 nm is formed on a mask (on a wafer: 120 nm on a 4× mask) and a film thicknesses of a TaN film and a Ru film are varied at an incident angle of 7.27 degrees.
Figure 15:
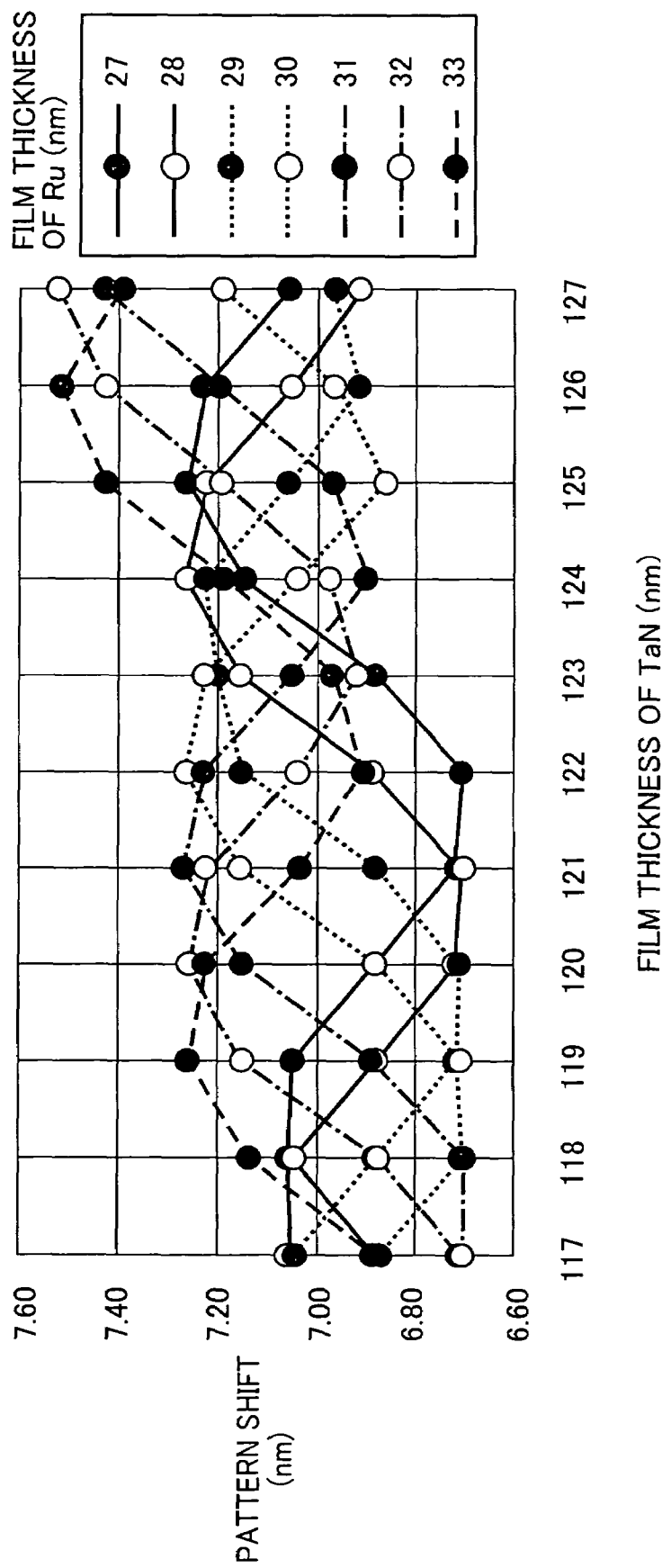
FIG. 15 is a schematic diagram describing a concrete example of the swing effect and the bulk effect with plotted values against a pattern shift in the case that a pattern having a width of 30 nm is formed on a mask (on a wafer: 120 nm on a 4× mask) and that film thicknesses of a TaN film and a Ru film are varied at an incident angle of 7.27 degrees.

FIG. 12 to FIG. 15 are schematic diagrams describing another concrete example of specified results of the swing effect and the bulk effect. FIG. 12 shows the swing effect and the bulk effect with plotted values against a line width in the case that a pattern having a width of 30 nm is formed on a mask (on a wafer: 120 nm on a 4× mask) and that the film thicknesses of the TaN film 14 and the Ru film 13 are varied at an incident angle of 4.84 degrees. FIG. 13 shows the swing effect and the bulk effect with plotted values against a pattern shift in the same conditions. FIG. 14 shows the swing effect and the bulk effect with plotted values against a line width in the case that a pattern having a width of 30 µm is formed on a mask (on a wafer: 120 nm on a 4× mask) and that the film thicknesses of the TaN film 14 and the Ru film 13 are varied at an incident angle of 7.27 degrees. FIG. 15 shows the swing effect and the bulk effect with plotted values against a pattern shift in the same conditions. The pattern pitch is 160 nm (on a wafer: 640 nm on a 4× mask).

Thereafter, a process for deciding the optimum value of the film thickness of the TaN film 14 in consideration of the specified swing effect and bulk effect will be described (at S105 shown in FIG. 2). It is assumed that before the optimum value is decided, the fluctuations of the forming film thicknesses of the TaN film 14 and the Ru film 13, namely the film forming accuracies of the films 13 and 14, have been obtained (at S104 shown in FIG. 2). The film forming accuracies are obtained in accordance with the performance of a film forming apparatus that forms the films 13 and 14, film forming conditions, and so forth. In the following description, it is assumed that the film forming accuracies are in the range of ±0 nm to ±3 nm.

It is assumed that the incident angle is 4.84 degrees. Assuming that the film thickness of the TaN film 14 is ±0 nm, it is found from FIG. 12 that the film thickness of the TaN film 14 in which the line width variation is at its minimum is 126 nm. At that point, the range of the line width variation is 1.64 nm. In addition, it is found from FIG. 13 that the film thickness of the TaN film 14 in which the pattern shift of the pattern is at its minimum is 123 nm. At that point, the range of the fluctuation of the pattern shift is 0.24 nm.

Assuming that the fluctuation of the film thickness of the TaN film 14 is ±1 nm, it is found from FIG. 12 that the film thickness of the TaN film 14 in which the line width variation is at its minimum is 126 nm. At that point, the range of the line width variation is 1.64 nm. In addition, it is found from FIG. 13 that the film thickness of the TaN film 14 in which the pattern shift is at its minimum is 123 nm. At that point, the range of the fluctuation of the pattern shift is 0.34 nm.

In addition, assuming that the fluctuation of the film thickness of the TaN film 14 is ±2 nm, it is found from FIG. 12 that the film thickness of the TaN film 14 in which the line width variation is at its minimum is 125 nm. At that point, the range of the line width variation is 1.86 nm. In addition, it is found from FIG. 13 that the film thickness of the TaN film 14 in which the pattern shift is at its minimum is 121 nm. At that point, the range of the fluctuation of the pattern shift is 0.39 nm.

In addition, assuming that the fluctuation of the film thickness of the TaN film 14 is ±3 nm, it is found from FIG. 12 that the film thickness of the TaN film 14 in which the line width variation is at its minimum is 123 nm. At that point, the range of the line width variation is 1.89 nm. In addition, it is found from FIG. 13 that the film thickness of the TaN film 14 in which the pattern shift is at its minimum is 120 nm. At that point, the range of the fluctuation of the pattern shift is 0.39 nm.

On the other hand, assuming that the fluctuation of the film thickness of the TaN film 14 is ±3 nm, it is found that from FIG. 12 that the film thickness of the TaN film 14 in which the line width variation is at its minimum is 120 nm. At that point, the range of the line width variation is 1.92 nm. In addition, it is found from FIG. 13 that the film thickness of the TaN film 14 in which the pattern shift is at its minimum is 123 nm. At that point, the range of the fluctuation of the pattern shift is 0.55 nm.

As described above, the film thickness of the TaN film 14 does not represent the relation in which when the line width variation is at its minimum, the fluctuation of the pattern shift is at its minimum. Instead, the film thickness of the TaN film 14 represents the relation of a trade-off between the line width variation and the fluctuation of the pattern shift. However, even in the relation of the trade-off, the range of the fluctuation of the pattern shift is smaller than the range of the line width variation.

Thus, when the optimum value of the film thickness of the TaN film 14 is decided by extracting the film thickness in which the range of the fluctuation of the pattern shift, namely, the pattern shift is at its minimum, the extracted film thickness is decided as the optimum value. For example, when the fluctuation of the film thickness of the TaN film 14 is ±3 nm, 120 nm is chosen as the optimum value of the film thickness of the TaN film 14. When the fluctuation of the film thickness of the TaN film 14 is ±2 nm, 121 nm is chosen as the optimum value of the film thickness of the TaN film 14. When the fluctuation of the film thickness of the TaN film 14 is ±1 nm, 123 nm is chosen as the optimum value of the film thickness of the TaN film 14.

This process applies also to the case that the incident angle is 7.27 degrees. For example, assuming that the fluctuation of the film thickness of the TaN film 14 is ±0 nm, it is found from FIG. 14 that the film thickness of the TaN film 14 in which pattern shift is at its minimum is 120 nm. At that point, the range of the line width variation is 1.64 nm. In addition, it is found from FIG. 15 that the film thickness of the TaN film 14 in which the pattern shift is at its minimum is 123 nm. At that point, the range of the fluctuation of the pattern shift is 0.35 nm.

In addition, assuming that the fluctuation of the film thickness of the TaN film 14 is ±1 nm it is found from FIG. 14 that the film thickness of the TaN film 14 in which the line width variation is at its minimum is 120 nm. At that point, the range of the line width variation is 1.78 nm. In addition, it is found from FIG. 15 that the film thickness of the TaN film 14 in which the pattern shift is at its minimum is 123 nm. At that point, the range of the fluctuation of the pattern shift is 0.56 nm.

In addition, assuming that the fluctuation of the film thickness of the TaN film 14 is ±2 nm, it is found from FIG. 14 that the film thickness of the TaN film 14 in which the line width variation is at its minimum is 122 nm. At that point, the range of the line width variation is 2.00. In addition, it is found from FIG. 15 that the film thickness of the TaN film 14 in which the pattern shift is at its minimum is 121 nm. At that point, the range of the fluctuation of the pattern shift is 0.57 nm.

In addition, assuming that the fluctuation of the film thickness of the TaN film 14 is ±3 nm, it is found from FIG. 14 that the film thickness of the TaN film 14 in which the line width variation is at its minimum is 123 nm. At that point, the range of the line width variation is 2.03 nm. In addition, it is found from FIG. 15 that the film thickness of the TaN film 14 in which the pattern shift is at its minimum is 120 nm. At that point, the range of the fluctuation of the pattern shift is 0.58 nm.

On the other hand, assuming that the fluctuation of the film thickness of the TaN film 14 is ±3 nm, it is found from FIG. 14 that the film thickness of the TaN film 14 in which the line width variation is at its maximum is 120 nm. At that point, the range of the line width variation is 2.33 nm. In addition, it is found from FIG. 15 that the film thickness of the TaN film 14 in which the pattern shift is at its maximum is 124 nm. At that point, the range of the fluctuation of the pattern shift is 0.83 nm.

Thus, in the case that the incident angle is 7.27 degrees, the film thickness of the TaN film 14 represents the relation of trade-off between the line width variation and the fluctuation of the pattern shift. The range of the line width variation is smaller than that of the pattern shift. Thus, in this case, the film thickness in which the pattern shift is at its minimum is decided as the optimum value of the film thickness of the TaN film 14. For example, assuming that the fluctuation of the film thickness of the TaN film 14 is ±3 nm, 120 nm is chosen as the optimum value of the film thickness of the TaN film 14 in which the range of the fluctuation of the pattern shift is at its minimum. In addition, assuming that the fluctuation of the film thickness of the TaN film 14 is ±2 nm, 121 nm is chosen as the optimum value of the film thickness of the TaN film 14. When the fluctuation of the film thickness of the TaN film 14 is ±1 nm, 123 nm is chosen as the optimum value of the film thickness of the TaN film 14.

In the foregoing decision process, the film thickness of the TaN film 14 is decided. The exposure mask 10 on which the TaN film 14 has been formed in accordance with the decision result is used. In this case, even if the swing effect and the bulk effect occur on a transferred image on a wafer or even if the forming film thicknesses of the TaN film 14 and the Ru film 13 fluctuate, the line width variation of the transferred image and the pattern shift can be minimized. Thus, the reflection type exposure mask 10 for extreme ultraviolet light is capable of properly dealing with a miniaturized structure of a pattern width, a pattern pitch, and so forth of a transferred image. As a result, the present embodiment is capable of contributing to the improvement of a semiconductor device.

According to the present embodiment, it is described that when the film thickness of the TaN film 14 is decided, the OD is decided so that the line width variation is at its minimum and further the optimum value of the film thickness of the TaN film 14 is decided in accordance with the decided OD so that the pattern shift is at its minimum. However, it should be noted that the present invention is not limited to the foregoing example. In other words, the process of deciding both the OD and the optimum value of film thickness of the TaN film 14 is most suitably performed by the above-recited exemplary method. However, by employing another method (of a conventional technology or the like), with one of the OD and the optimum value of the film thickness, the film thickness of the TaN film 14 can be decided. In this case, in consideration of the swing effect and the bulk effect, the line width variation and the pattern shift of the transferred image can be more suppressed than before.

In addition, according to the present embodiment, it is described that when the film thickness of the TaN film 14 is decided, the OD is decided in accordance with the line width so that the line width variation is at its minimum, while, on the other hand, the optimum value of the film thickness is decided in accordance with the pattern shift so that the pattern shift is at its minimum. However, it should be noted that the present invention is not limited to the foregoing examples. For example, the OD may be decided in accordance with the pattern shift or the optimum value of the film thickness may be decided in accordance with the line width. Alternatively, the OD and the optimum value of the film thickness may be decided in accordance with both the line width and the pattern shift. In other words, the OD and the optimum value of the film thickness may be decided with either or both of the line width variation of the transferred image and the amount of the pattern shift, which become clear from the specified results of the swing effect and the bulk effect. In addition, according to the present embodiment, an example in which the TaN film 14 functions as an absorber film and the Ru film 13 functions as a buffer film is described. However, it should be noted that the forming material of each film is not limited to the foregoing example.

Figure 16:
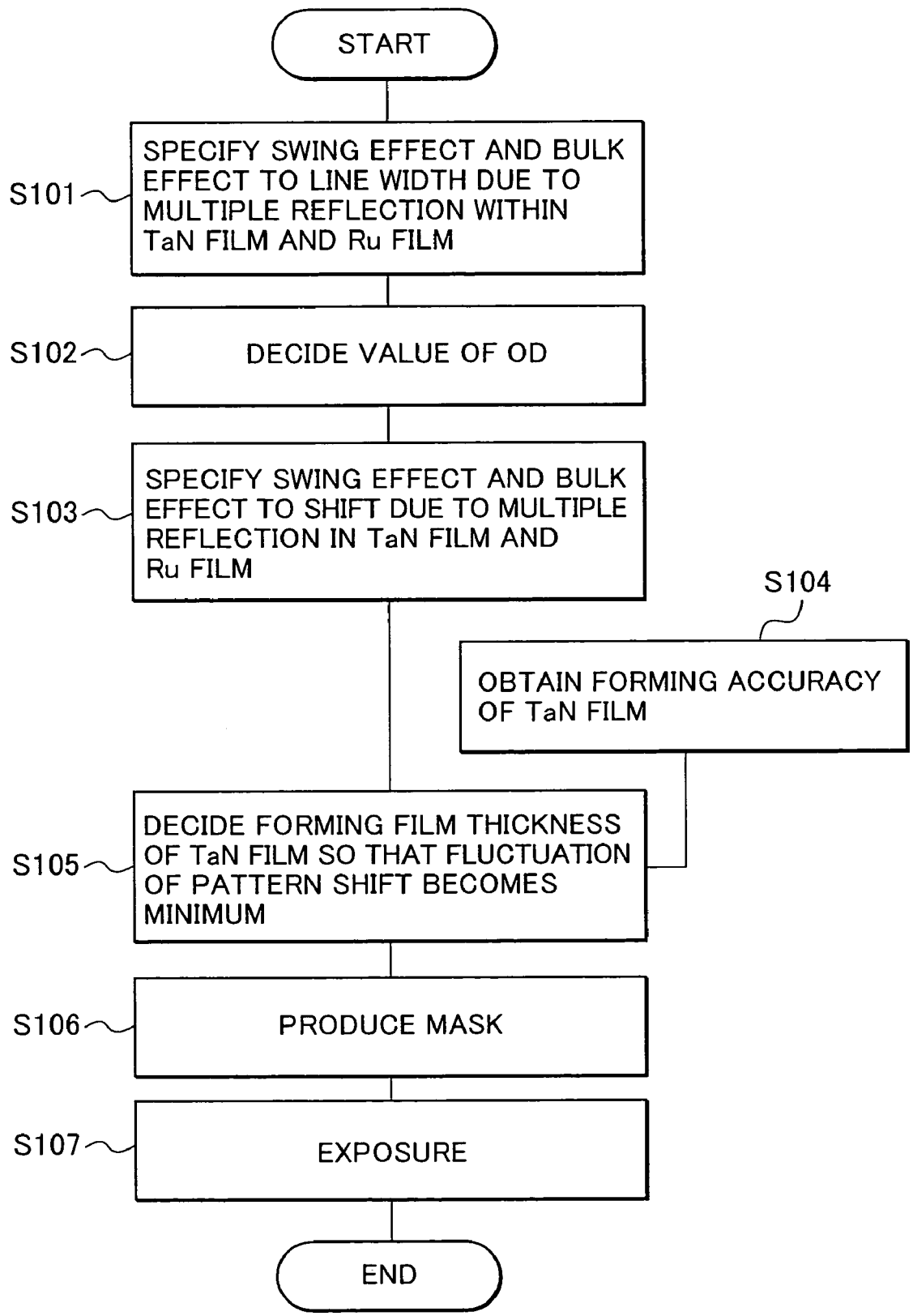
FIG. 16 is a flow chart showing an example of a process of a method for producing a semiconductor device including a step for using an exposure mask according to the present invention.

Next, a method for producing a semiconductor device using the exposure mask 10 described above will be described. FIG. 16 is a flow chart showing an example of a process of a method for producing a semiconductor device, the process including a step for using an exposure mask to which the present invention is applied. In the drawing, step (S101), which specifies the swing effect and the bulk effect that may occur on a transferred image of a pattern formed with the TaN film 14 of the exposure mask 10, to step (S105), which decides a forming film thickness of the TaN film 14, are similar to those of the foregoing example (see FIG. 2). Thus, their description will be omitted.

After the forming film thickness of the TaN film 14 has been decided, the exposure mask 10 having the structure shown in FIG. 1 is produced in accordance with the decision results (at S106). As a result, the exposure mask 10 on which the TaN film 14 has been formed for the film thickness in which the line width variation and the pattern shift are at their minimum values is obtained. Since the films 13 and 14 are formed by a known technology, their description will be omitted.

Thereafter, with the produced exposure mask 10, a wafer as an exposure object is exposed with a beam (exposure light) having the same wavelength as light reflected by the mask blanks 12 of the exposure mask 10 (at S107). In other words, a lithography process for forming a circuit pattern of a semiconductor device is performed with the exposure mask 10.

Thus, since the exposure mask 10 has the TaN film 14 having a film thickness that allows the line width variation and the pattern shift exposed on a wafer to be at their minimum, the exposure mask 10 is capable of properly miniaturizing the pattern width, pattern pitch, and so forth of a transferred image. In other words, when a semiconductor device is produced by a process including a lithography process using the exposure mask 10, since the line width variation and the pattern shift exposed on a wafer are at their minimum, the exposure mask 10 is capable of contributing to the improvement of a semiconductor device (as a proper approach for miniaturization of a semiconductor device).

As a beam for exposing an object, X-ray, radiation beam, radiation ray, charged particle radiation, ultraviolet ray, ultraviolet light, visible light, or a ray of light can be used, as well as extreme ultraviolet light, for the present invention.

As an example of an electron beam exposing technology, the low energy electron proximity projection lithography (LEEPL) is known. In the LEEPL, a stencil mask of which holes corresponding to a device pattern are formed in a membrane having a thickness of several 100 nm is used. A mask is placed immediately above a wafer so that the space therebetween becomes around several 10 μm By scanning a pattern portion of the mask with an electron beam of several 10 keV, the pattern is transferred to the wafer (T. Utsumi, Journal of Vacuum Science and Technology B 17, 2897 (1999)). Thus, an electron beam that is emitted from a low acceleration electron gun passes through an aperture. A condenser lens causes the electron beam to become a parallel beam. The parallel beam passes through a deflector and irradiates a wafer through a mask In this case, when the exposure mask according to the present invention is used, the pattern width, pattern pitch, and so forth of a transferred image can be properly miniaturized. As a result, the exposure mask according to the present invention is capable of contributing to the improvement of the performance of the semiconductor device.

In addition, a method of which a small-segmented membrane is supported by a grid structure is known. The method is used for a mask in SCALPEL (scattering with angular limitation in projection electron-beam lithography), PREVAIL (projection exposure with variable axis immersion lenses), and an EB stepper (for example, L. R. Harriott, Journal of Vacuum Science and Technology B15, 2130 (1997); H. C. Pfeiffer, Japanese Journal of Applied Physics 34,6658 (1995)). In SCALPEL, an electron beam that is emitted from a low acceleration electron beam passes through an aperture. A condenser lens causes the electron beam to become a parallel beam. The parallel beam irradiates a wafer through a deflector and a mask In PREVAIL, a condenser lens, a reticule, a first projection lens, a crossover aperture, a second projection lens, a sample, and an under-sample lens are disposed in that order from the electron beam source side. In the structure, a reticule pattern is transferred in a reduced size to the sample. In these cases, with the exposure mask according to the present invention, the pattern width, pattern pitch, and so forth of a transferred image can also be properly miniaturized. As a result, the exposure mask according to the present invention can contribute to the improvement of the performance of the semiconductor device.

INDUSTRIAL APPLICABILITY

Since the forming film thickness of the absorber film is decided in consideration of the swing effect and the bulk effect due to the influence of the absorber film and the buffer film, the line width variation and the pattern shift exposed on the wafer are at their minimum values, even for a reflection type exposure mask for extreme ultraviolet light. Thus, the exposure mask allows the pattern width, the pattern pitch, and so forth of a transferred image to be miniaturized. As a result, the exposure mask is capable of contributing to the improvement of the performance of the semiconductor device.

The invention claimed is:

1. A method for producing a reflective exposure mask, the reflective exposure mask including:
    a stack of reflective layers for reflecting exposure light;
    an absorber film functioning to absorb said exposure light for covering a light reflection plane side of said stack of reflective layers with a predetermined pattern; and
    a buffer film interposed between said stack of reflective layers and said absorber film;
    said method comprising the steps of:
    specifying a swing effect and a bulk effect, which occur on a transferred image on said exposure object due to multiple reflections within said absorber film and said buffer film to at least one fluctuation of a line width and pattern shift in a transferred portion of said predetermined pattern, in accordance with characteristic values of forming materials of said absorber film and said buffer film and optical conditions when exposing, upon deciding a forming film thickness of said absorber film; and
    deciding an optical density that is a deciding condition of said forming film thickness of said absorber film in consideration of said specified swing effect and said specified bulk effect so that said fluctuation of said line width of said pattern and/or pattern shift of said pattern is minimized.

2. The method for producing the reflective exposure mask according to claim 1, wherein said exposure light is extreme ultraviolet light, X-ray, radiation ray, ultraviolet light, or visible light.

3. The method for producing the reflective exposure mask according to claim 1, wherein said absorber film is a film made of tantalum nitride.

4. The method for producing the reflective exposure mask according to claim 1, wherein said buffer film is a film made of ruthenium.

5. The method for producing the reflective exposure mask according to claim 1, wherein said absorber film is a film made of tantalum nitride and said buffer film is a film made of ruthenium.

6. A method for producing a reflective exposure mask, the reflective exposure mask including:
    a stack of reflective layers for reflecting exposure light;
    an absorber film functioning to absorb said exposure light for covering a light reflection plane side of said stack of reflective layers with a predetermined pattern; and
    a buffer film interposed between said stack of reflective layers and said absorber film;
    said method comprising the steps of:
    specifying a swing effect and a bulk effect, which occur on a transferred image on said exposure object due to multiple reflections within said absorber film and said buffer film to at least one fluctuation of a line width and pattern shift in a transferred portion of said predetermined pattern, in accordance with characteristic values of forming materials of said absorber film and said buffer film and optical conditions when exposing, upon deciding a forming film thickness of said absorber film; and
    deciding an optical density that is a deciding condition of said forming film thickness of said absorber film in consideration of said specified swing effect, said specified bulk effect and forming accuracy when said absorber film is formed so that said fluctuation of said line width of said pattern and/or pattern shift of said pattern is minimized.

7. The method for producing the reflective exposure mask according to claim 6, wherein said exposure light is extreme ultraviolet light, X-ray, radiation ray, ultraviolet light, or visible light.

8. The method for producing the reflective exposure mask according to claim 6, wherein said absorber film is a film made of tantalum nitride.

9. The method for producing the reflective exposure mask according to claim 6, wherein said buffer film is a film made of ruthenium.

10. The method for producing the reflective exposure mask according to claim 6, wherein said absorber film is a film made of tantalum nitride and said buffer film is a film made of ruthenium.

11. A reflective exposure mask used for exposing an exposure object in a production process of a semiconductor device, the reflective exposure mask comprising:
   a stack of reflective layers for reflecting exposure light;
   an absorber film functioning to absorb said exposure light for covering a light reflection plane side of said stack of reflective layers with a predetermined pattern; and
   a buffer film interposed between said stack of reflective layers and said absorber film;
   wherein a swing effect and a bulk effect, which occur on a transferred image on said exposure object due to multiple reflections within said absorber film and said buffer film to at least one fluctuation of a line width and pattern shift in a transferred portion of said predetermined pattern, is specified in accordance with characteristic values of forming materials of said absorber film and said buffer film and optical conditions when exposing, upon deciding a forming film thickness of said absorber film; and
   an optical density that is a deciding condition of said forming film thickness of said absorber film is decided in consideration of said specified swing effect and said specified bulk effect so that said fluctuation of said line width of said pattern and/or pattern shift of said pattern is minimized.

12. The reflective exposure mask according to claim 11, wherein said exposure light is extreme ultraviolet light, X-ray, radiation ray, ultraviolet light, or visible light.

13. A reflective exposure mask used for exposing an exposure object in a production process of a semiconductor device, comprising:
   a stack of reflective layers for reflecting exposure light,
   an absorber film functioning to absorb said exposure light for covering a light reflection plane side of said stack of reflective layers with a predetermined pattern, and
   a buffer film interposed between said stack of reflective layers and said absorber film;
   wherein a swing effect and a bulk effect, which occur on a transferred image on said exposure object due to multiple reflections within said absorber film and said buffer film to at least one fluctuation of a line width and pattern shift in a transferred portion of said predetermined pattern, is specified in accordance with characteristic values of forming materials of said absorber film and said buffer film and optical conditions when exposing, upon deciding a forming film thickness of said absorber film; and
   an optical density that is a deciding condition of said forming film thickness of said absorber film is decided in consideration of said specified swing effect, said specified bulk effect and forming accuracy when said absorber film is formed so that said fluctuation of said line width of said pattern and/or pattern shift of said pattern is minimized.

14. The reflective exposure mask according to claim 13, wherein said exposure light is extreme ultraviolet light, X-ray, radiation ray, ultraviolet light, or visible light.

15. A method of using a reflective exposure mask for producing a semiconductor device, the reflective exposure mask including:
   a stack of reflective layers for reflecting exposure light;
   an absorber film functioning to absorb said exposure light for covering a light reflection plane side of said stack of reflective layers with a predetermined pattern; and
   a buffer film interposed between said stack of reflective layers and said absorber film;
   said method comprising the steps of:
   specifying a swing effect and a bulk effect, which occur on a transferred image on said exposure object due to multiple reflections within said absorber film and said buffer film to at least one fluctuation of a line width and pattern shift in a transferred portion of said predetermined pattern, in accordance with characteristic values of forming materials of said absorber film and said buffer film and optical conditions when exposing, upon deciding a forming film thickness of said absorber film; and
   deciding an optical density that is a deciding condition of said forming film thickness of said absorber film in consideration of said specified swing effect and said specified bulk effect so that said fluctuation of said line width of said pattern and/or pattern shift of said pattern is minimized.

16. The method according to claim 15, wherein said exposure light is extreme ultraviolet light, X-ray, radiation ray, ultraviolet light, or visible light.

17. The method according to claim 15, wherein said absorber film is a film made of tantalum nitride and said buffer film is a film made of ruthenium.

18. A method for producing a semiconductor device by using a reflective exposure mask, the reflective exposure mask including:
   a stack of reflective layers for reflecting exposure light,
   an absorber film functioning to absorb said exposure light for covering a light reflection plane side of said stack of reflective layers with a predetermined pattern, and
   a buffer film interposed between said stack of reflective layers and said absorber film;
   said method comprising the steps of:
   specifying a swing effect and a bulk effect, which occur on a transferred image on said exposure object due to multiple reflections within said absorber film and said buffer film to at least one fluctuation of a line width and pattern shift in a transferred portion of a predetermined pattern, in accordance with characteristic values of forming materials of said absorber film and said buffer film and optical conditions when exposing, upon deciding a forming film thickness of said absorber film; and
   deciding an optical density that is a deciding condition of said forming film thickness of said absorber film in consideration of said specified swing effect, said specified bulk effect and forming accuracy when said absorber film is formed so that said fluctuation of said line width of said pattern and/or pattern shift of said pattern is minimized.

19. The method for producing a semiconductor device according to claim 18, wherein said exposure light is extreme ultraviolet light, X-ray, radiation ray, ultraviolet light, or visible light.

20. The method for producing a semiconductor device according to claim 18, wherein said absorber film is a film made of tantalum nitride and said buffer film is a film made of ruthenium.

* * * * *